United States Patent
Khlebnikov et al.

(10) Patent No.: US 11,519,098 B2
(45) Date of Patent: Dec. 6, 2022

(54) DISLOCATION DISTRIBUTION FOR SILICON CARBIDE CRYSTALLINE MATERIALS

(71) Applicant: Wolfspeed, Inc., Durham, NC (US)

(72) Inventors: Yuri Khlebnikov, Raleigh, NC (US); Robert T. Leonard, Raleigh, NC (US); Elif Balkas, Cary, NC (US); Steven Griffiths, Morrisville, NC (US); Valeri Tsvetkov, Durham, NC (US); Michael Paisley, Raleigh, NC (US)

(73) Assignee: Wolfspeed, Inc., Durham, NC (US)

( * ) Notice: Subject to any disclaimer, the term of this patent is extended or adjusted under 35 U.S.C. 154(b) by 348 days.

(21) Appl. No.: 16/775,407

(22) Filed: Jan. 29, 2020

(65) Prior Publication Data
US 2021/0230769 A1    Jul. 29, 2021

(51) Int. Cl.
| | |
|---|---|
| *H01L 29/16* | (2006.01) |
| *C30B 29/36* | (2006.01) |
| *H01L 29/32* | (2006.01) |
| *C30B 23/02* | (2006.01) |

(52) U.S. Cl.
CPC .......... *C30B 29/36* (2013.01); *H01L 29/1608* (2013.01); *H01L 29/32* (2013.01); *C30B 23/02* (2013.01)

(58) Field of Classification Search
CPC ...... C30B 29/36; H01L 29/1608; H01L 29/32
See application file for complete search history.

(56) References Cited

U.S. PATENT DOCUMENTS

| | | | |
|---|---|---|---|
| 7,563,321 B2 | 7/2009 | Powell et al. | |
| 2013/0280466 A1* | 10/2013 | Zwieback | B28D 5/00 428/64.1 |
| 2016/0032486 A1 | 2/2016 | Hansen et al. | |
| 2017/0321345 A1* | 11/2017 | Xu | C30B 29/36 |
| 2018/0066380 A1 | 3/2018 | Tani et al. | |
| 2018/0282902 A1* | 10/2018 | Nakabayashi | C30B 29/36 |
| 2020/0365685 A1 | 11/2020 | Leonard et al. | |

(Continued)

OTHER PUBLICATIONS

Stockmeier, M., et al., "On the lattice parameters of silicon carbide," Journal of Applied Physics, vol. 105, Feb. 2009, American Institute of Physics, 5 pages.

(Continued)

*Primary Examiner* — Nicholas J Tobergte
(74) *Attorney, Agent, or Firm* — Withrow & Terranova, P.L.L.C.

(57) ABSTRACT

Silicon carbide (SiC) wafers, SiC boules, and related methods are disclosed that provide improved dislocation distributions. SiC boules are provided that demonstrate reduced dislocation densities and improved dislocation uniformity across longer boule lengths. Corresponding SiC wafers include reduced total dislocation density (TDD) values and improved TDD radial uniformity. Growth conditions for SiC crystalline materials include providing source materials in oversaturated quantities where amounts of the source materials present during growth are significantly higher than what would typically be required. Such SiC crystalline materials and related methods are suitable for providing large diameter SiC boules and corresponding SiC wafers with improved crystalline quality.

46 Claims, 14 Drawing Sheets

(56) References Cited

U.S. PATENT DOCUMENTS

2021/0272298 A1    9/2021  Leonard et al.

OTHER PUBLICATIONS

Sumakeris, J.J., et al., "Dislocation Characterization in 4H-SiC Crystals," Materials Science Forum, vol. 858, May 2016, pp. 393-396.
International Search Report and Written Opinion for International Patent Application No. PCT/US2021/013022, dated Mar. 22, 2021, 16 pages.
Examination Report for Taiwanese Patent Application No. 110102676, dated Aug. 25, 2021, 16 pages.

\* cited by examiner

DISLOCATION DISTRIBUTION FOR SILICON CARBIDE CRYSTALLINE MATERIALS

FIELD OF THE DISCLOSURE

The present disclosure relates to crystalline materials, and more specifically to dislocation distributions in silicon carbide crystalline materials.

BACKGROUND

Silicon carbide (SiC) exhibits many attractive electrical and thermophysical properties. SiC is especially useful due to its physical strength and high resistance to chemical attack as well as various electronic properties, including radiation hardness, high breakdown field, a relatively wide band gap, high saturated electron drift velocity, high temperature operation, and absorption and emission of high energy photons in the blue, violet, and ultraviolet regions of the spectrum. Compared with conventional wafer or substrate materials, including silicon and sapphire, such properties of SiC make it more suitable for the fabrication of wafers or substrates for high power density solid state devices, such as power electronic, radio frequency, and optoelectronic devices. SiC occurs in many different crystal structures called polytypes, with certain polytypes (e.g., 4H-SiC and 6H-SiC) having a hexagonal crystal structure.

While SiC exhibits superior materials properties, crystal growth techniques required to grow SiC are very different and significantly more challenging than conventional growth processes for other crystalline materials. Conventional crystalline materials utilized in semiconductor manufacturing, such as silicon and sapphire, have significantly lower melting points, allowing for direct crystal growth techniques from melted source materials that enable fabrication of large diameter crystalline materials. In contrast, bulk crystalline SiC is often produced by a seeded sublimation growth process at high temperatures where various challenges include impurity incorporation, structural defects associated with thermal and crystallographic stress, and formation of different polytypes, among others. In a typical SiC growth technique, a substrate and a source material are both placed inside of a reaction crucible. A thermal gradient created when the crucible is heated encourages vapor phase movement of the materials from the source material to the substrate followed by condensation upon the substrate and resulting bulk crystal growth. It is known that impurities can be introduced as dopants into SiC and that these dopants can regulate certain properties. For sublimation growth of SiC, a dopant can be introduced into the chamber in a variety of manners so that the dopant will be present in the SiC crystal produced from that process. The process is controlled to provide an appropriate concentration of the dopant for a particular application. Following bulk crystal growth, individual wafers of SiC may be obtained by slicing a bulk crystal ingot or boule of SiC, and the individual wafers may subsequently be subjected to additional processes, such as lapping or polishing.

The unique properties of SiC wafers enable the design and fabrication of an array of high power and/or high frequency semiconductor devices. Continuous development has led to a level of maturity in the fabrication of SiC wafers that allows such semiconductor devices to be manufactured for increasingly widespread commercial applications. As the semiconductor device industry continues to mature, SiC wafers having larger usable diameters are desired. Usable diameters of SiC wafers can be limited by certain structural defects in the material composition of SiC as well as certain wafer shape characteristics. Structural defects in the material composition may include dislocations (e.g., micropipes, threading edge, threading screw and/or basal plane dislocations), hexagonal voids, and stacking faults, among others. Wafer shape characteristics associated with SiC may include warp, bow, and thickness variation that can relate to wafer flatness. These various structural defects and wafer shape characteristics can contribute to crystallographic stresses that can be detrimental to fabrication and proper operation of semiconductor devices subsequently formed on conventional SiC wafers. Such crystallographic stresses are generally proportional to the radius of the wafer squared and as a result, it is difficult to economically fabricate larger diameter SiC semiconductor wafers of high quality.

The art continues to seek improved SiC wafers with larger diameters and related solid-state devices while overcoming challenges associated with conventional SiC wafers.

SUMMARY

Silicon carbide (SiC) wafers, SiC boules, and related methods are disclosed that provide improved dislocation distributions. SiC boules are provided that demonstrate reduced dislocation densities and improved dislocation uniformity across longer boule lengths. Corresponding SiC wafers include reduced total dislocation density (TDD) values with improved TDD radial uniformity. Growth conditions for SiC crystalline materials include providing source materials in oversaturated quantities where amounts of the source materials present during growth are significantly higher than what would typically be required. Such SiC crystalline materials and related methods are suitable for providing large diameter SiC boules and corresponding SiC wafers with improved crystalline quality.

In one aspect, a SiC wafer comprises a diameter of at least 145 millimeters (mm) and a total dislocation density (TDD) of less than or equal to 3000 per square centimeter ($cm^2$) for any annular ring comprising a 1 mm width and an outer diameter corresponding to a radial wafer position in a range including 3 mm and 50 mm of a center of the SiC wafer. In certain embodiments, the TDD is less than or equal to 3000 per $cm^2$ for any annular ring comprising a 1 mm width and the outer diameter corresponding to a radial wafer position in a range including 3 mm from the center of the SiC wafer and 2 mm from a perimeter edge of the SiC wafer. In certain embodiments, the TDD is less than or equal to 2500 per $cm^2$ for any annular ring comprising a 1 mm width and the outer diameter corresponding to the radial wafer position in the range including 3 mm and 50 mm of the center of the SiC wafer. In certain embodiments, the TDD is less than or equal to 2000 per $cm^2$ for any annular ring comprising a 1 mm width and the outer diameter corresponding to the radial wafer position for at least 50% of all radial wafer positions of the SiC wafer. In certain embodiments, the TDD is less than or equal to 1500 per $cm^2$ for any annular ring comprising a 1 mm width and the outer diameter corresponding to the radial wafer position for at least 50% of all radial positions of the SiC wafer. In certain embodiments, the diameter is in a range including 145 mm to 205 mm. In certain embodiments, the diameter is in a range including 145 mm to 155 mm. In certain embodiments, the SiC wafer comprises a 4H-SiC wafer. In certain embodiments, the SiC wafer comprises semi-insulating SiC. In certain embodiments, the SiC wafer comprises n-type SiC. In certain embodiments, the TDD is greater than or equal to 1000 per $cm^2$.

In another aspect, a SiC wafer comprises a diameter of at least 145 mm and a coefficient of variation for TDD of less than or equal to 0.3 for a wafer area that is divided into annular rings with 1 mm widths and the wafer area is bounded by a radial wafer position of 3 mm from a center of the SiC wafer and 2 mm from a perimeter edge of the SiC wafer. In certain embodiments, the coefficient of variation is less than or equal to 0.2. In certain embodiments, the coefficient of variation is greater than or equal to 0.1. In certain embodiments, the TDD is less than or equal to 3000 per $cm^2$ for any annular ring comprising a 1 mm width and an outer diameter corresponding to a radial wafer position in a range including 3 mm and 50 mm of the center of the SiC wafer. In certain embodiments, the TDD is less than or equal to 2000 per $cm^2$ for any annular ring comprising a 1 mm width and an outer diameter corresponding to a radial wafer position for at least 50% of all radial wafer positions of the SiC wafer. In certain embodiments, the SiC wafer comprises a 4H-SiC wafer. In certain embodiments, the SiC wafer comprises semi-insulating SiC. In certain embodiments, the SiC wafer comprises n-type SiC. In certain embodiments, the diameter is in a range including 145 mm to 155 mm. In certain embodiments, the diameter is in a range including 145 mm to 205 mm.

In another aspect, a SiC boule comprises a diameter in a range including 145 mm to 180 mm and a boule height greater than 50 mm. In certain embodiments, at least 75% of the height of the SiC boule is configured to provide a plurality of SiC wafers and each SiC wafer of the plurality of SiC wafers comprises a TDD of less than or equal to 4600 per $cm^2$ for a wafer area that includes a center of the SiC wafer and is radially bounded by a radial wafer position of 2 mm from a perimeter edge of the SiC wafer. In certain embodiments, the TDD is greater than or equal to 1000 per $cm^2$. In certain embodiments, at least 40% of the height of the SiC boule is configured to provide a plurality of SiC wafers and each SiC wafer of the plurality of SiC wafers comprises a TDD of less than or equal to 3000 per square centimeter for a wafer area that includes a center of the SiC wafer and is radially bounded by a radial wafer position of 2 mm from a perimeter edge of the SiC wafer. In certain embodiments, the TDD is greater than or equal to 1000 per $cm^2$. In certain embodiments, the boule height is in a range including 60 mm to 300 mm. In certain embodiments, the boule height is in a range including 55 mm to 80 mm. In certain embodiments, the boule height is in a range including 60 mm to 70 mm. In certain embodiments, the boule height is less than or equal to 65 mm. In certain embodiments, the boule height is greater than or equal to 55 mm and less than or equal to 65 mm.

In another aspect, a SiC boule comprises a diameter in a range including 145 mm to 180 mm and a boule height greater than or equal to 40 mm, wherein at least 50% of the height of the SiC boule is configured to produce a plurality of SiC wafers and each SiC wafer of the plurality of SiC wafers comprises a TDD of less than or equal to 4600 per $cm^2$ for a wafer area that includes a center of the SiC wafer and is radially bounded by a radial wafer position of 2 mm from a perimeter edge of the SiC wafer. In certain embodiments, the boule height is in a range including 40 mm to 300 mm. In certain embodiments, the boule height is in a range including 40 mm to 80 mm. In certain embodiments, the TDD is greater than or equal to 1000 per $cm^2$. In certain embodiments, at least 80% of the height of the SiC boule is configured to produce a plurality of SiC wafers comprising a mean TDD of less than or equal to 4600 per $cm^2$. In certain embodiments, at least 40% of the height of the SiC boule is configured to produce a plurality of SiC wafers and each SiC wafer of the plurality of SiC wafers comprises a mean TDD of less than or equal to 3000 per $cm^2$ for a wafer area that includes a center of the SiC wafer and is radially bounded by a radial wafer position of 2 mm from a perimeter edge of the SiC wafer. In certain embodiments, the TDD is greater than or equal to 1000 per $cm^2$.

In another aspect, a SiC wafer comprises a TDD of less than or equal to 3500 per $cm^2$ for a wafer area that includes a center of the SiC wafer and is radially bounded by a radial wafer position of 2 mm from a perimeter edge of the SiC wafer, wherein the SiC wafer is taken from a boule position of greater than or equal to 40 mm as measured from a seed. In certain embodiments, the boule position is in a range comprising 40 mm and 300 mm, or in a range comprising 40 mm and 80 mm, or in a range comprising 40 mm and 65 mm. In certain embodiments, the TDD is greater than or equal to 500 per $cm^2$. In certain embodiments, the TDD is less than or equal to 2500 per $cm^2$ or less than or equal to 1500 per $cm^2$. In certain embodiments, the SiC wafer comprises a diameter that is greater than or equal to 145 mm and less than or equal to 180 mm.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1A and FIG. 1B illustrate a process of growing crystalline silicon carbide (SiC) according to embodiments disclosed herein.

FIG. 2 includes a first frame providing a perspective view of a crystalline ingot received by a conventional wire saw tool and being subjected to a wire sawing process, and a second frame providing a perspective view of multiple wafers obtained by the wire sawing process.

DETAILED DESCRIPTION

Figure 1A:
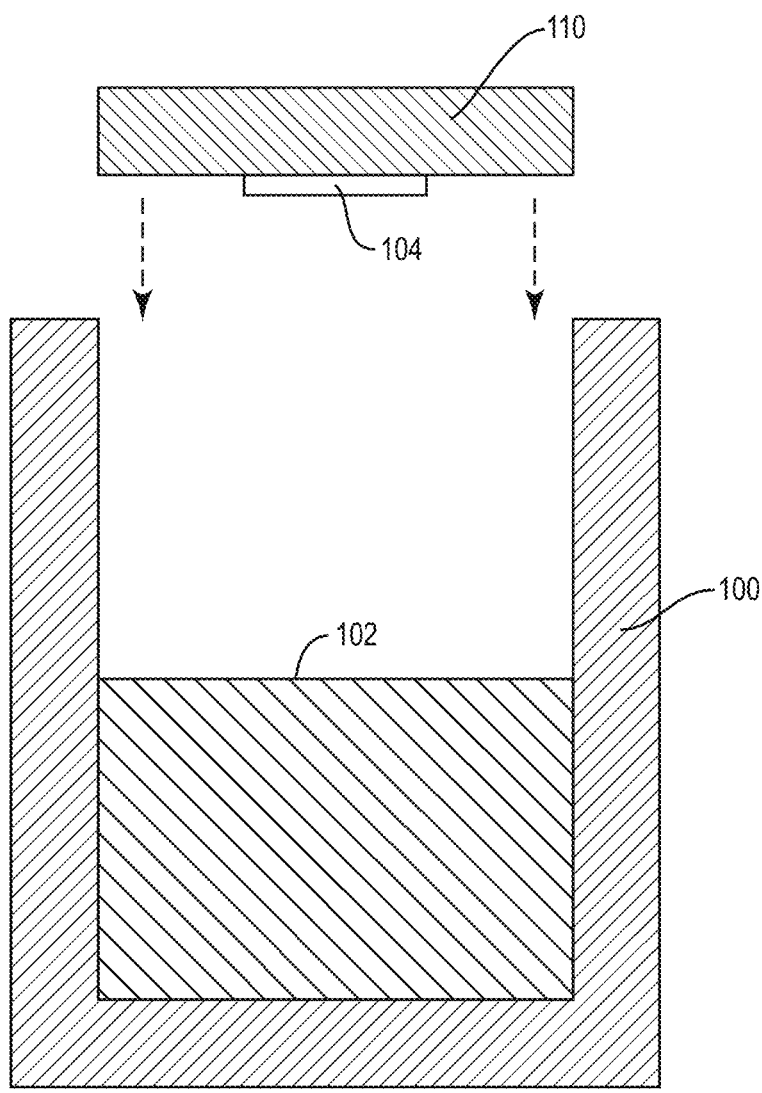

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Common elements between figures may be shown herein with common element numbers and may not be subsequently re-described.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Silicon carbide (SiC) wafers, SiC boules, and related methods are disclosed that provide improved dislocation distributions. SiC boules are provided that demonstrate reduced dislocation densities and improved dislocation uniformity across longer boule lengths. Corresponding SiC wafers include reduced total dislocation density (TDD) values with improved TDD radial uniformity. Growth conditions for SiC crystalline materials include providing source materials in oversaturated quantities where amounts of the source materials present during growth are significantly higher than what would typically be required. Such SiC crystalline materials and related methods are suitable for providing large diameter SiC boules and corresponding SiC wafers with improved crystalline quality.

SiC can be a very challenging crystalline material to grow since at normal pressures it does not have a liquid state but instead converts directly from a solid to a gas and back to a solid. This makes it different from most materials in that liquid phase growth is not available. Another major challenge for SiC crystal growth is the very low stacking fault energy observed in SiC which makes it very easy to introduce additional planes of atoms and their associated defect structures into the crystalline lattice. This low stacking fault energy combined with the very high temperatures employed in conventional physical vapor transport growth of SiC make it challenging to maintain growth in a regime where the energy available from local stress fields is below the energy required to create stacking faults. Crystallographic stress in SiC can be controlled by many factors. Crystal height and crystal diameter can play important roles as the stress can increase proportionately to the crystal height and to the square power of the diameter. Conventional SiC growth techniques have achieved 100 and 150 millimeter (mm) diameter SiC crystals. Dimensions of such SiC crystals can be limited to prevent induced crystal stress from exceeding a critical resolved shear stress for the SiC crystal where high densities of dislocations are formed. For larger diameter SiC crystals (e.g., ≥150 mm) as disclosed herein, the amount the diameter is increased can disproportionately increase the crystal stress, thereby producing shorter crystal heights during growth. In this regard, conventional crystal growth techniques are not necessarily scalable for larger diameters.

General aspects of seeded sublimation growth processes for SiC are well established. As such, those skilled in the field of crystal growth and particularly those skilled in the field of SiC growth and related systems will recognize that specific details of a given technique or process can vary depending on many relevant circumstances, processing conditions, and equipment configurations. Accordingly, the descriptions given herein are most appropriately given in a general and schematic sense with the recognition that those persons of skill in the art will be able to implement and use various embodiments disclosed herein based on the provided disclosure without undue experimentation. Additionally, those skilled in this art will recognize that SiC sublimation systems of the type described herein are commercially available in various standard configurations. Alternately, sublimation systems may be designed and implemented in custom configurations, where necessary or appropriate. Accordingly, the embodiments described herein are not limited to a particular subset of sublimation systems, or any particular system configuration. Rather, many different types and configurations of sublimation systems may be used to grow crystalline SiC material in accordance with embodiments disclosed herein.

Figure 1B:
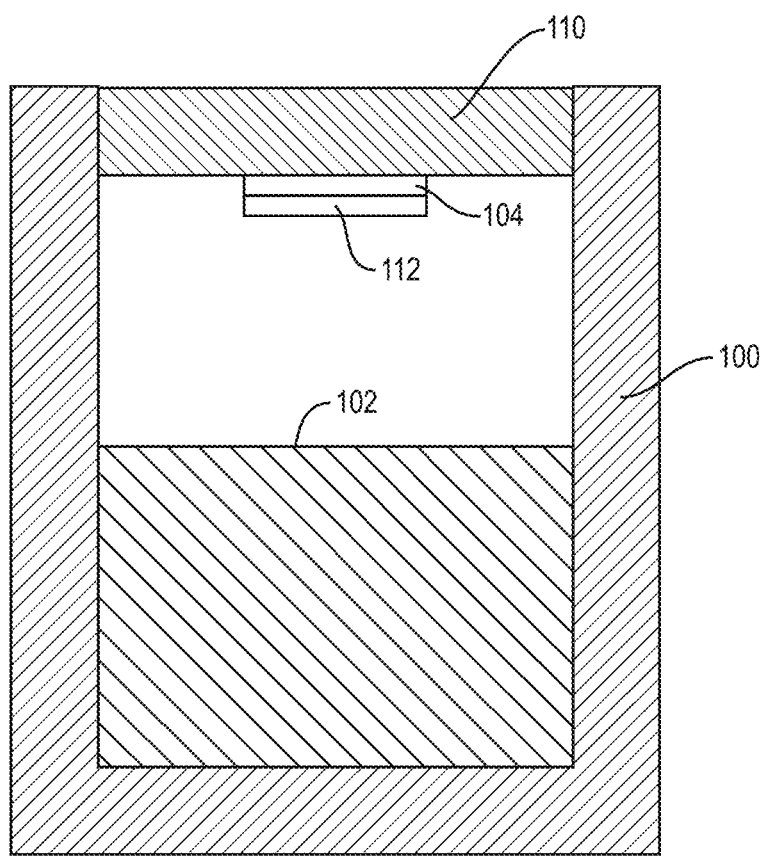

FIG. 1A and FIG. 1B illustrate a process of growing a crystal according to embodiments disclosed herein. In FIG. 1A, a crucible 100 contains source material 102 and an interior of the crucible 100 serves as a growth zone. The source material 102 may include any suitable material such as silicon (Si), carbon (C), SiC, silicon compounds, carbon compounds, or combinations of any or all of the foregoing in any of various forms, including but not limited to one or more combinations of solids, powders, and gases. Other optional elements such as dopants (e.g., nitrogen (N), among others) and strain compensating components (e.g., germanium (Ge), tin (Sn), arsenic (As), and phosphorus (P), among others) may also be included in the source material 102. Strain compensating components, when present, are preferably either isoelectronic or have the same majority carrier type (e.g., n-type or p-type, donor or acceptor) as the dopants. Alternatively one, some, or all of the other elements can be introduced into the growth zone in ways other than inclusion in the source material 102. A seed 104, such as crystalline SiC, may be placed near a crucible lid 110 that is subsequently placed on the crucible 100 as indicated by the dashed arrows of FIG. 1A. In this manner, the seed 104 is suspended in the crucible 100 above the source material 102 as the crucible 100 is heated. In other arrangements, the seed 104 could be placed anywhere within the crucible 100, such as along bottom or side surfaces of the crucible 100.

During crystal growth, the source material 102 sublimes and forms SiC on the seed 104. Sublimation may occur when the source material 102 is heated to a temperature in a range including 1200° C. to 3000° C., or 1800° C. to 3000° C., or 1800° C. to 2500° C., or 1800° C. to 2000° C., or 2000° C. to 2200° C., among other temperature ranges. While the temperature of the source material 102 is being raised, the temperature of the growth surface of the seed 104 is likewise raised to a temperature approaching the temperature of the source material 102. Typically, the growth surface of the seed 104 is heated to a temperature in a range including 1200° C. to 3000° C., or 1800° C. to 3000° C., or 1800° C. to 2500° C., or 1700° C. to 2400° C., or 1800° C. to 2000° C., or 2000° C. to 2200° C., among other temperature ranges. During the growth process, the crucible 100 is evacuated slowly to reduce pressure. In certain embodiments, growth may be performed at a pressure in a range including 0.1 torr to 50 torr, or 0.1 torr to 25 torr, or 0.1 torr to 15 torr, or 1 torr to 15 torr, among other pressure ranges. Growth temperatures and growth pressures may generally vary with one another. For example, depending on the growth conditions, higher growth temperatures may be associated with higher growth pressures or lower growth temperatures may be associated with lower growth pressures. By maintaining the source material 102 and the growth surface of the seed 104 at their respective temperatures for a sufficient time, macroscopic growth of monocrystalline SiC of a desired polytype may form upon the seed 104.

Turning to FIG. 1B, a SiC crystal 112 is grown from sublimation of the source material 102 in the crucible 100 using a physical vapor transport process. Crystal growth takes place until growth of the SiC crystal 112 reaches a certain length. The length (or height from the seed 104) depends in part on the type of post-formation processing to be employed. The length may also be limited by various crystalline quality characteristics of the SiC crystal 112, including structural crystalline defects. The point where the growth of the SiC crystal 112 is stopped will also depend on such parameters as the size and type of crucible 100 and any concentration of the dopant and strain compensating component when present in the source material 102. This point can be determined in advance through experimental growths coupled with examination of the resulting SiC crystal 112 to determine concentrations of the impurities. Once the SiC crystal 112 has reached the desired size, the system may be backfilled with an inert gas to raise the pressure, and the temperature may slowly be reduced to an intermediate temperature, and then more quickly to room temperature. In certain embodiments, the intermediate temperature may be about 90%, or 80%, or 70% of the growth temperature, among other temperatures. The intermediate temperature may include a range from 150° C. to 2000° C., or 150° C. to 1200° C., or 150° C. to 500° C., or 175° C. to 225° C., among other temperature ranges. The resulting SiC crystal 112 may form a crystalline boule or ingot.

Sublimation growth of SiC can be accomplished with various growth systems, differently sized crucibles, different types of crucibles of various materials and using varying heating methods. Specific growth temperatures and pressures can be adapted by one of skill in the art to accommodate these variables. In the typical case, where such variables as the type or size of the crucible are changed, some experimental growths may need to be performed as mentioned above, to settle on the best growth conditions for a specific system. After crystal growth, the SiC crystal 112 forms a bulk crystalline material, sometimes referred to as a boule or an ingot.

Figure 2:
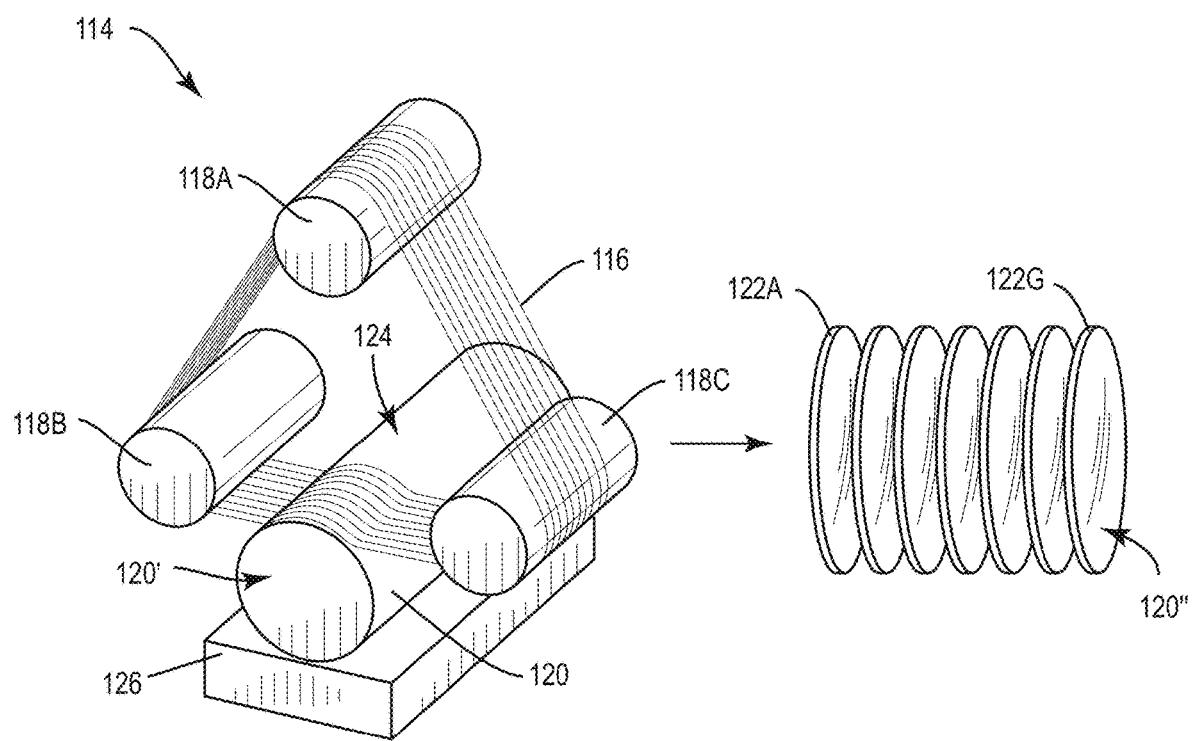

Various microelectronic, optoelectronic, and microfabrication applications require thin layers of crystalline materials as a starting structure for fabricating various useful systems. Various methods for forming thin layers of crystalline materials from bulk crystalline materials include sawing and laser-assisted separation techniques. In certain embodiments, a method for cutting thin layers (e.g., wafers or substrates) from crystalline boules or ingots involves the use of wire saws. Wire sawing technology has been applied to various crystalline materials, such as Si, sapphire, and SiC. A wire saw tool may include an ultra-fine steel wire (typically having a diameter of 0.2 mm or less) that is passed through grooves of one or many guide rollers. Two slicing methods exist, namely, loose abrasive slicing and fixed abrasive slicing. Loose abrasive slicing involves application of a slurry (typically a suspension of abrasives in oil) to a steel wire running at high speed, whereby the rolling motion of abrasives between the wire and the workpiece results in cutting of the boule or ingot. For fixed abrasive slicing, a wire fixed with diamond abrasives may be used in a method that requires only a water-soluble coolant liquid (i.e., not a slurry). High-efficiency parallel slicing permits a large number of wafers to be produced in a single slicing procedure. FIG. 2 illustrates a typical wire saw tool 114 including parallel wire sections 116 extending between rollers 118A-118C and arranged to simultaneously saw an ingot 120 into multiple thin sections (e.g., wafers 122A-122G) each having a face generally parallel to an end face 120' of the ingot 120. During the sawing process, the wire sections 116 supported by the rollers 118A-118C may be pressed in a downward direction 124 toward a holder 126 underlying the ingot 120. If the end face 120' is parallel to a crystallographic c-plane of the ingot 120, and the wire sections 116 saw through the ingot 120 parallel to the end face 120', then each resulting wafer 122A-122G will have an "on-axis" end face 120" that is parallel to the crystallographic c-plane. Wire-sawing can introduce various stresses related to the separation process that impact shapes of the resulting wafers, particularly for large-diameter wafers.

Figure 3:
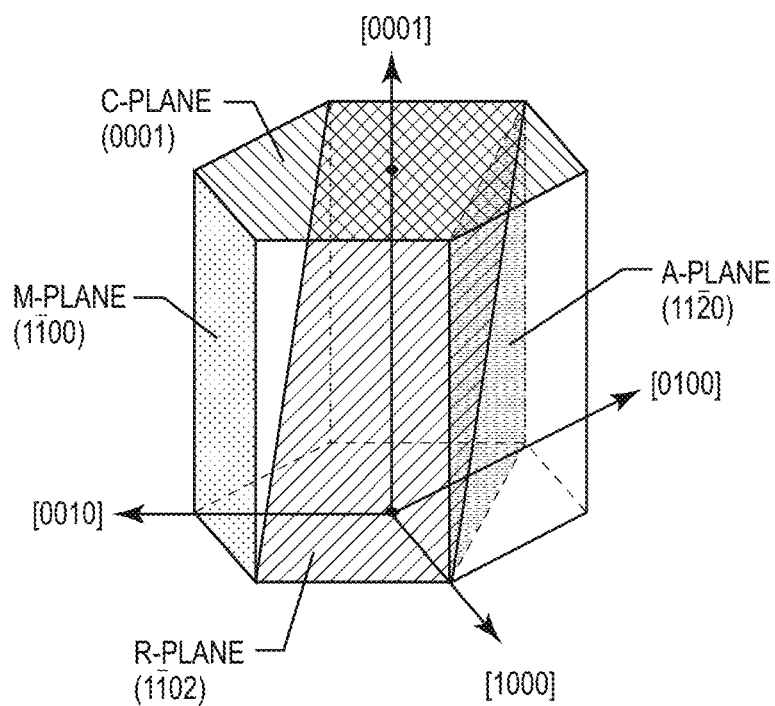
FIG. 3 is a first perspective view crystal plane diagram showing the coordinate system for a hexagonal crystal such as 4H-SiC.

FIG. 3 is a first perspective view crystal plane diagram showing the coordinate system for a hexagonal crystal such as 4H-SiC, in which the c-plane ((0001) plane), corresponding to a [0001] (vertical) direction of epitaxial crystal growth, is perpendicular to both the m-plane ((1$\bar{1}$00) plane) and the a-plane ((11$\bar{2}$0) plane), and non-perpendicular with the r-plane ((1$\bar{1}$02) plane). On-axis SiC wafers having small offcut (e.g., less than half a degree from the crystallographic c-plane) are frequently employed as growth substrates for high-quality epitaxial growth of homoepitaxial layers of SiC as well as other materials (e.g., aluminum nitride (AlN) and other Group III nitrides).

It is also possible to produce vicinal (also known as offcut or "off-axis") wafers having end faces that are not parallel to the crystallographic c-plane. Vicinal wafers (e.g., of SiC) having various degrees (e.g., 0.1, 0.25, 0.5, 0.75, 1, 2, 4, 6, 8, or more degrees) offcut are frequently employed as growth substrates for high-quality epitaxial growth of homoepitaxial layers of SiC as well as other materials (e.g., AlN and other Group III nitrides). Vicinal wafers may be produced either by growing a boule or ingot in a direction away from the c-axis (e.g., growing over a vicinal seed material and sawing the ingot perpendicular to the ingot sidewalls), or by growing an ingot starting with an on-axis seed material and sawing or cutting the ingot at an angle that departs from perpendicular to the ingot sidewalls.

Figure 4:
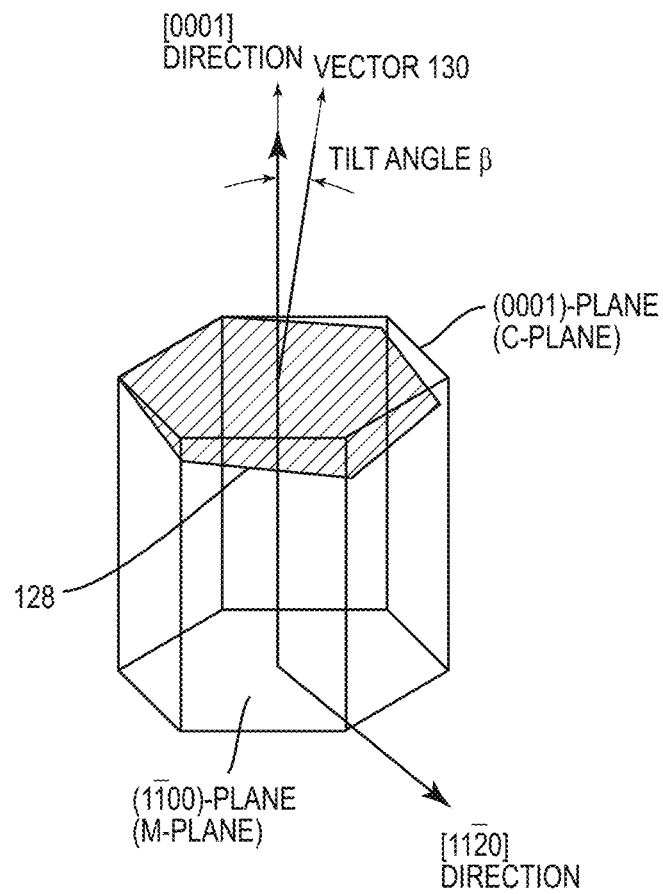
FIG. 4 is a second perspective view crystal plane diagram for a hexagonal crystal, illustrating a plane that is non-parallel to the c-plane.

FIG. 4 is a second perspective view crystal plane diagram for a hexagonal crystal, illustrating a plane 128 that is non-parallel to the c-plane, wherein a vector 130 (which is normal to the plane 128) is tilted away from the [0001] direction by a tilt angle β, with the tilt angle β being inclined (slightly) toward the [11$\bar{2}$0] direction.

Figure 5A:
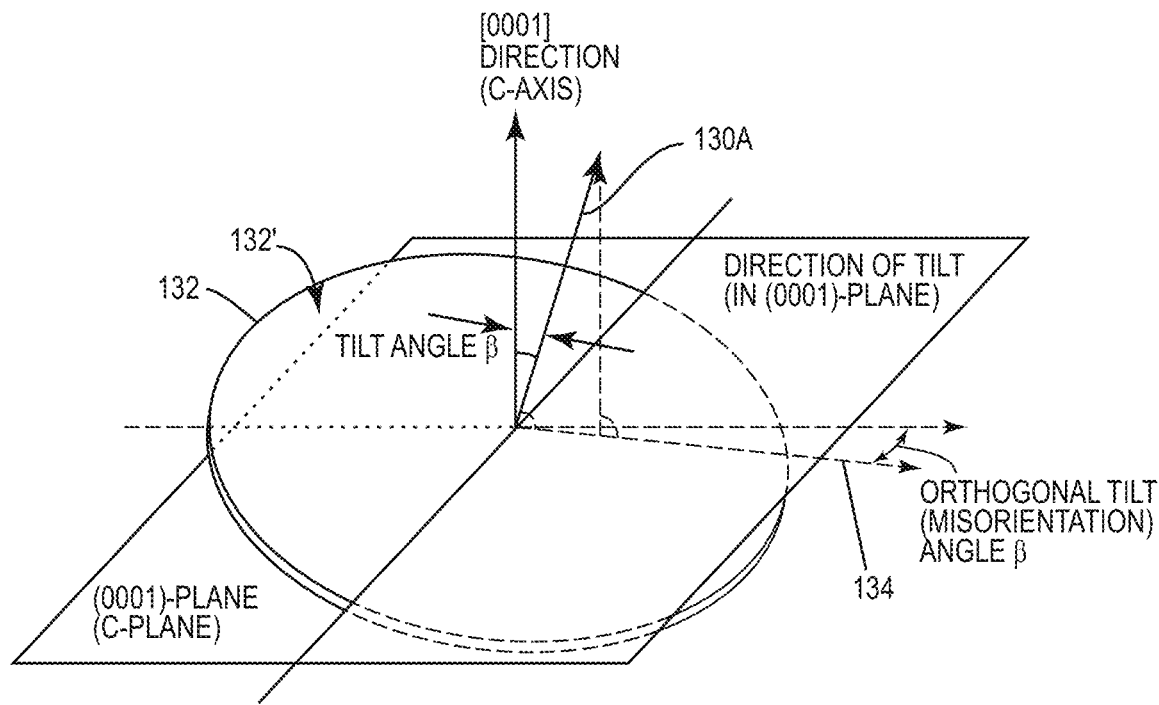
FIG. 5A is a perspective view wafer orientation diagram showing orientation of a vicinal wafer relative to the c-plane.
Figure 5B:
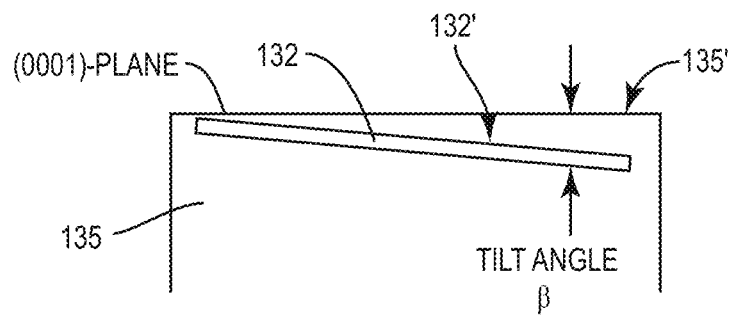
FIG. 5B is a simplified cross-sectional view of the vicinal wafer of FIG. 5A superimposed over a portion of an ingot.

FIG. 5A is a perspective view wafer orientation diagram showing orientation of a vicinal wafer 132 relative to the c-plane ((0001) plane), in which a vector 130A (which is normal to a wafer face 132') is tilted away from the [0001] direction by the tilt angle β. This tilt angle β is equal to an orthogonal tilt (or misorientation angle) β that spans between the (0001) plane and a projection 134 of the wafer face 132'. FIG. 5B is a simplified cross-sectional view of the vicinal wafer 132 superimposed over a portion of an ingot 135 (e.g., an on-axis ingot having an end face 135' parallel to the (0001) plane from which the vicinal wafer 132 may be defined. FIG. 5B shows that the wafer face 132' of the vicinal wafer 132 is misaligned relative to the (0001) plane by the tilt angle β.

Figure 6A:
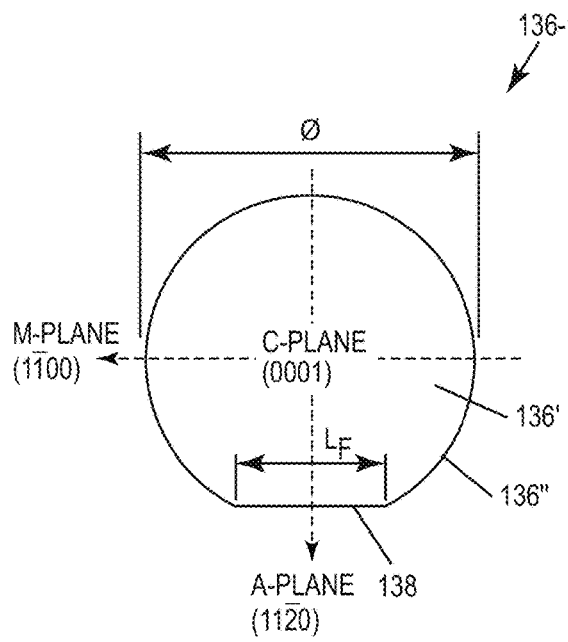
FIG. 6A and FIG. 6B are top plan views of exemplary SiC wafers, with superimposed arrows showing crystallographic planes.
Figure 6B:
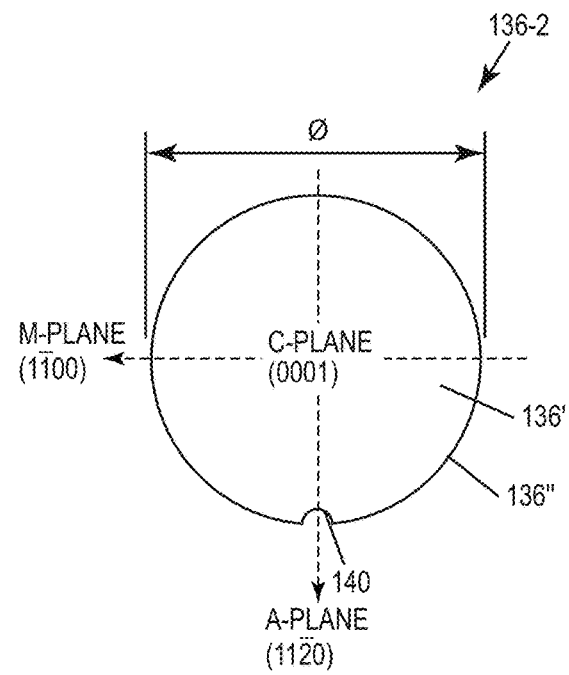

FIGS. 6A and 6B are top plan views of exemplary SiC wafers 136-1, 136-2 that include an upper face 136' (e.g., that is parallel to the (0001) plane (c-plane) and perpendicular to the [0001] direction) and are laterally bounded by a generally round edge 136" (having a diameter Ø). In FIG. 6A, the round edge 136" of the SiC wafer 136-1 includes a primary flat 138 (having a length $L_F$) that is perpendicular to the (11$\bar{2}$0) plane, and parallel to the [11$\bar{2}$0] direction. In FIG. 6B, the round edge 136" of the SiC wafer 136-2 includes a notch 140 in place of the primary flat 138 illustrated in FIG. 6A. Depending on the particular application, the notch 140 may be provided for compatibility with various semiconductor manufacturing tools on which the SiC wafer 136-2 may be processed. As previously described, the SiC wafers 136-1, 136-2 may also be misaligned with (e.g., off-axis at an oblique angle relative to) the c-plane.

Another method for separating wafers or substrates from bulk crystalline material comprises a laser-assisted separation technique that includes forming laser subsurface damage within the bulk crystalline material and subsequently separating a wafer from the bulk crystalline material along the laser subsurface damage. Tools for forming subsurface damage in crystalline materials permit laser emissions to be focused within an interior of a crystalline material, and enable lateral movement of a laser relative to the crystalline material. Typical laser damage patterns may include formation of parallel lines that are laterally spaced relative to one another at a depth within the crystalline material. Parameters such as focusing depth, laser power, translation speed, and subsurface damage line spacing may be adjusted to impart laser damage, but adjustment of certain factors involves tradeoffs. Increasing laser power tends to impart greater subsurface damage that may enhance ease of fracturing (e.g., by reducing the stress required to complete fracturing), but greater subsurface damage increases surface irregularities along surfaces exposed by fracturing, such that additional processing may be required to render such surfaces sufficiently smooth for subsequent processing (e.g., for incorporation in electronic devices), and the additional processing leads to additional kerf losses. Reducing lateral spacing between subsurface laser damage lines may also enhance ease of fracturing, but a reduction in spacing between laser damage lines increases the number of translational passes between a substrate and a laser, thereby reducing tool throughput. Such laser-assisted separation techniques may provide reduced kerf losses as compared with wire sawing techniques. Kerf loss refers to a total amount of material loss associated with forming an individual wafer from bulk crystalline material.

Figure 7:
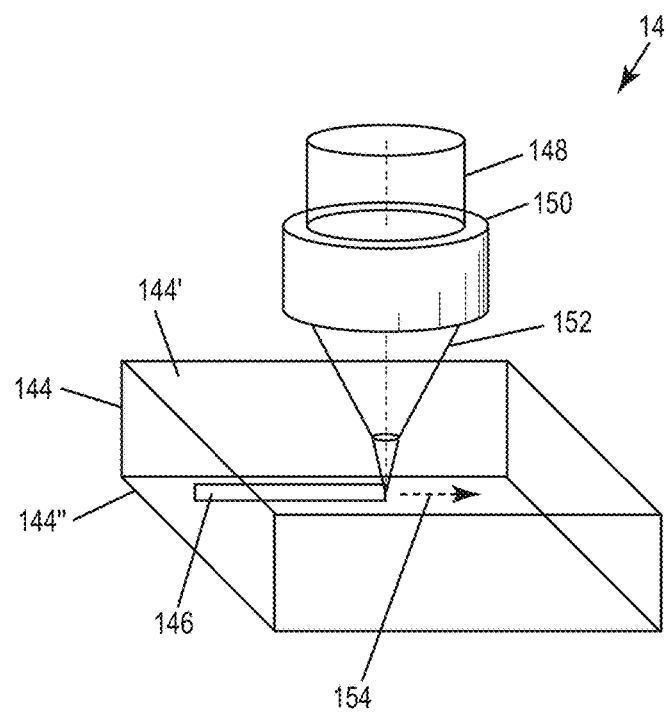
FIG. 7 is a perspective view schematic of an exemplary laser tool configured to focus laser emissions within an interior of a crystalline material for laser-assisted separation.

FIG. 7 is a perspective view schematic of one example of a laser tool 142 configured to focus laser emissions within an interior of a crystalline material 144 (e.g., SiC or the like) to form subsurface damage 146. The crystalline material 144 includes an upper surface 144' and an opposing lower surface 144", and the subsurface damage 146 is formed in the interior of the crystalline material 144 between the upper and lower surfaces 144', 144". Laser emissions 148 are focused with a lens assembly 150 to yield a focused beam 152, with a focal point thereof being in the interior of the crystalline material 144. Such laser emissions 148 may be pulsed at any suitable frequency (typically in the nanosecond, picosecond, or femtosecond range) and beam intensity, with a wavelength below the bandgap of the crystalline material 144 to permit the laser emissions 148 to be focused at a targeted depth below a surface thereof. At the focal point, the beam size and short pulse width results in an energy density high enough to result in very localized absorption that forms the subsurface damage 146. One or more properties of the lens assembly 150 may be altered to adjust a focal point of the focused beam 152 to a desired depth within the crystalline material 144. Relative lateral motion (e.g., lateral translation) between the lens assembly 150 and the crystalline material 144 may be effected to propagate the subsurface damage 146 in a desired direction 154, as schematically illustrated by a dashed line. Such lateral movement may be repeated in various patterns, including patterns as described hereinafter.

As used herein, a "substrate" or a "wafer" refers to a crystalline material, such as a single crystal semiconductor material. In certain embodiments, a substrate may have sufficient thickness (i) to be surface processed (e.g., lapped and polished) to support epitaxial deposition of one or more semiconductor material layers, and optionally (ii) to be free-standing if and when separated from a rigid carrier. In certain embodiments, a substrate may have a generally cylindrical or circular shape, and/or may have a thickness of at least about one or more of the following thicknesses: 200 microns (µm), 300 µm, 350 µm, 500 µm, 750 µm, 1 mm, 2 mm, or more or less. In certain embodiments, a substrate may include a thicker substrate that is divisible into two thinner substrates. In certain embodiments, a substrate may be part of a thicker substrate or wafer having one or more epitaxial layers (optionally in conjunction with one or more metal contacts) arranged thereon as part of a device wafer with a plurality of electrically operative devices. The device wafer may be divided in accordance with aspects of the present disclosure to yield a thinner device wafer and a second thinner wafer on which one or more epitaxial layers (optionally in conjunction with one or more metal contacts) may be subsequently formed. In certain embodiments, large diameter wafers or substrates may comprise a diameter of 145 mm or greater, or 150 mm or greater, or 195 mm or greater, or 200 mm or greater, or 300 mm or greater, or 450 mm or greater, or in a range including 145 mm to 455 mm, or 195 mm to 455 mm, or 145 mm to 205 mm. In certain embodiments, a wafer or substrate may comprise 4H-SiC with a diameter of 145 mm or greater, or 150 mm or greater, or 195 mm or greater, or 200 mm or greater, and a thickness in a range of 100 µm to 1000 µm, or in a range of 100 µm to 800 µm, or in a range of 100 µm to 600 µm, or in a range of 150 µm to 500 µm, or in a range of 150 µm to 400 µm, or in a range of 200 µm to 500 µm, or in a range of 300 µm to 1000 µm, or in a range of 500 µm to 2000 µm, or in a range of 500 µm to 1500 µm, or in any other thickness range or having any other thickness value specified herein. In certain embodiments, the terms "substrate" and "wafer" may be used interchangeably as a wafer is typically used as a substrate for semiconductor devices that may be formed thereon. As such, a substrate or a wafer may refer to free-standing crystalline material that has been separated from a larger bulk crystalline material or substrate.

With regard to relative dimensions, the term "approximately" is defined to mean a nominal dimension within a certain tolerance, such as plus or minus 5 mm from a diameter dimension. For example, as used herein, a wafer with a "150 mm" diameter may encompass a diameter range including 145 mm to 155 mm, a wafer with a "200 mm" diameter may encompass a diameter range including 195 mm to 205 mm, a wafer with a "300 mm" diameter may encompass a diameter range including 295 mm to 305 mm, and a wafer with a "450 mm" diameter may encompass a diameter range including 445 mm to 455 mm. In further embodiments, such tolerances may be smaller, such as plus or minus 1 mm, or plus or minus 0.25 mm.

Embodiments disclosed herein may be applied to substrates or wafers of various crystalline materials, of both single crystal and polycrystalline varieties. In certain embodiments, substrates or wafers may comprise cubic, hexagonal, and other crystal structures, and may comprise crystalline materials having on-axis and off-axis crystallographic orientations. Exemplary embodiments may include single crystal semiconductor materials having hexagonal crystal structure, such as 4H-SiC or 6H-SiC. Various illustrative embodiments described hereinafter mention SiC generally or 4H-SiC specifically, but it is to be appreciated that other suitable crystalline materials may be used. Among the various SiC polytypes, the 4H-SiC polytype is particularly attractive for power electronic devices due to its high thermal conductivity, wide bandgap, and isotropic electron mobility. Embodiments disclosed herein may apply to on-axis SiC (i.e., with no intentional angular deviation from the c-plane thereof) or off-axis SiC (i.e., typically departing from a grown axis such as the c-axis by a non-zero angle, typically in a range of from 0.5 to 10 degrees or a subrange thereof such as 2 to 6 degrees or another subrange). Certain embodiments disclosed herein may utilize on-axis 4H-SiC or vicinal (off-axis) 4H-SiC having an offcut in a range including 1 to 10 degrees, or 2 to 6 degrees, or about 2, 4, 6, or 8 degrees.

Embodiments disclosed herein may also apply to both doped crystalline semiconductor materials (e.g., N-doped conductive SiC and/or P-doped SiC), co-doped, and/or undoped crystalline semiconductor materials (e.g., semi-insulating SiC or high resistivity SiC). In certain embodiments, SiC crystalline materials, including SiC boules and SiC wafers, may comprise N-type doping (including intentional and unintentional dopants such as N) with concentrations in a range including $1\times10^{17}$ cm$^{-3}$ to $1\times10^{21}$ cm$^{-3}$, or in a range including $1\times10^{17}$ cm$^{-3}$ to $3\times10^{18}$ cm$^{-3}$, or in a range from $1\times10^{18}$ cm$^{-3}$ to $1\times10^{19}$ cm$^{-3}$, or in a range from $1\times10^{18}$ cm$^{-3}$ to $3\times10^{18}$ cm$^{-3}$, or less than $1\times10^{17}$ cm$^{-3}$ among others. In certain embodiments, N-doped SiC crystalline materials may have a resistivity in a range including 0.001 ohm-cm to 0.05 ohm-cm, or in a range including 0.001 ohm-cm to 0.03 ohm-cm, or in a range from 0.005 ohm-cm to 0.05 ohm-cm, or in a range from 0.005 ohm-cm to 0.03 ohm-cm. In other embodiments, higher resistivity SiC crystalline materials, including semi-insulating SiC boules and semi-insulating SiC wafers, may comprise unintentionally doped or undoped SiC with a resistivity of at least 1500 ohm-cm, or at least 5000 ohm-cm, or at least 50,000 ohm-cm, or at least $1\times10^5$ ohm-cm, or at least $1\times10^6$ ohm-cm, or at least $1\times10^9$ ohm-cm or in a range including 1500 ohm-cm to $1\times10^9$ ohm-cm, or in a range including $1\times10^5$ ohm-cm to $1\times10^9$ ohm-cm. Semi-insulating SiC wafers may be doped with vanadium (V), aluminum (Al), or combinations thereof. Co-doped SiC wafers may comprise combinations of two or more dopants, such as N, Al, and V, among others depending on the embodiment.

Crystalline SiC can include various structural crystal defects, including dislocations (e.g., micropipes, threading edge, threading screw and/or basal plane dislocations, among others), hexagonal voids, and stacking faults, among others. Structural crystal defects may be formed during crystal growth and/or during cooldown after growth where one or more discontinuities are formed in the material lattice structure of crystalline SiC. Such structural crystal defects can be detrimental to fabrication, proper operation, device yield, and reliability of semiconductor devices subsequently formed on SiC wafers. The presence of various structural crystal defects can provide stress in freestanding SiC wafers that may contribute to various deviations in wafer shape (e.g., reduced flatness characteristics). Additional deviations to wafer shape may be formed during wafer separation from boules or ingots by either wire cutting or laser-assisted separation techniques as previously described.

During bulk growth, crystalline defects tend to initially form with higher densities in portions of the SiC boule that are near the seed. As growth progresses further away from the seed, crystalline defect densities can decrease in middle portions of the SiC boule before increasing to levels near or even higher than the initial portions of the SiC boule. In this regard, middle portions of SiC boules typically yield the most useable SiC wafers while overall boule lengths can be limited by increasing defect densities, particularly for larger diameter boules. According to embodiments disclosed herein, growth conditions for SiC boules are provided that demonstrate reduced defect densities, including later stages of growth, thereby allowing growth of longer SiC boules that produce increased quantities of SiC wafers having lower defect densities. In certain embodiments, such growth conditions include providing source materials in oversaturated quantities, where the amount of source materials present during growth are significantly higher than what would typically be required for growth. In this growth state, an increased portion of source materials may not be incorporated into the growing SiC boules, thereby increasing the amount of source material waste that may be lost to parasitic deposition within the crucible or through exhaust, when present, while maintaining the crucible at a certain pressure. As disclosed herein, growing with such oversaturated source conditions, which may have previously been considered wasteful, may provide crystalline SiC with decreased dislocation densities and longer overall SiC boules. This may be particularly useful for larger diameter SiC boules, such as greater than 145 mm, where defect densities can limit usable boule lengths.

Figure 8:
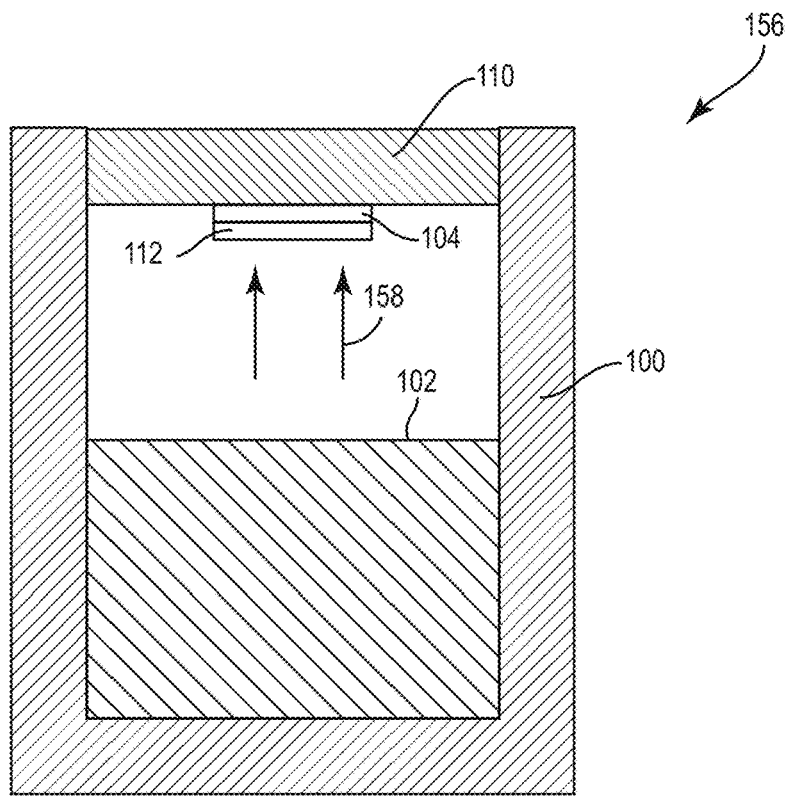
FIG. 8 is a cross-sectional illustration of a SiC growth system that is similar to the illustration of FIG. 1B, with added arrows to indicate vapor flux between the source material and the seed.

FIG. 8 is a cross-sectional illustration of a SiC growth system 156 that includes the crucible 100, the source material 102, the seed 104, and the crucible lid 110 used to form the SiC crystal 112 as described for FIG. 1B. Both the source material 102 and the seed 104 are generally contained in the crucible 100, and the source material 102 may be positioned above, below, or adjacent to the seed 104. In certain embodiments, the crucible 100 may be made of a material that is relatively stable to Si- and C-containing gases. In certain embodiments, the crucible 100 may include one or more of graphite, tantalum carbide (TaC)- and niobium carbide (NbC)-coated graphite, and solid TaC and NbC, among others. In certain embodiments, the crucible 100 may either be sealed to prevent gas escape, or partially open to allow some gas flow out of the crucible 100. In certain embodiments, the crucible 100 may be electrically conductive to allow induction heating, while in other embodiments radiative heating may be used, and in still other embodiments, combinations of induction and radiative heating may be used. In certain embodiments, the temperature profile in the crucible 100 may be controlled such that both the heat input to the system is considered and insulation baffles are used to control heat flow. In certain embodiments, the source material 102 may be kept at a higher temperature than the seed 104 such that a temperature gradient is created within the crucible 100. This temperature gradient helps to provide the transport of a vapor flux 158 that contains Si- and C-containing gas species from the source material 102 to the seed 104. As the source material 102 sublimes and condenses on the seed 104 to form the SiC crystal 112, the vapor flux 158 may also be driven by gas flow from the source material 102 to the seed 104. In certain embodiments, gas sources may either be driven through a high temperature region to enable cracking of the gas into constituent parts for interaction with the seed 104, or various gas species can interact directly with the seed 104. In certain embodiments, one or more high frequency electric fields are used to aid the gas cracking process.

Growth conditions for the SiC crystal 112 may typically be carried out by a supply of vapor flux 158 to the seed 104 for deposition of Si and C constituents onto the seed 104. The ways to achieve this are many and the embodiments described herein are provided for altering certain aspects of SiC crystal growth to reduce crystalline defects in SiC boules and resulting SiC wafers. The vapor flux 158 may be provided by generating one or more of SiC, SiC$_2$, Si$_2$C and Si gases through heating up the source material 102 that may include one or more of polycrystalline SiC; single crystalline SiC; polymers of Si and C; a mixture of Si and C powders with a 1:1 ratio of Si to C or within a 20% tolerance of the 1:1 ratio; a mixture of SiC, Si, and C powders where the Si to C ratio is 1:1 or within a 20% tolerance of the 1:1 ratio; pucks or lumps of amorphous or crystalline SiC (e.g., polycrystalline or single crystalline); and porous meshes of SiC. In certain embodiments, gaseous sources may also be used to supply the vapor flux 158, separately or in addition to the source material 102 described above. Such gas sources may include one or more species such as SiH$_4$, Si$_2$H$_6$, SiCl$_2$H$_2$, SiCl$_3$H SiCl$_4$, CH$_4$, C$_2$H$_6$ and Si(CH$_3$)$_4$. In embodiments that include a combination of gaseous and solid sources, the ratio of Si to C in the solid source may be altered away from 1:1 as some of the Si or C supply is being provided by the gas.

In certain embodiments, these sources may predominantly include pure SiC, but impurities may often be added to achieve deliberate doping of the crystals, modification of the surface energies, deliberate generation of point defects and modification of the lattice size. These impurities can include almost any element in the period table, often Group III elements such as boron (B) to induce p-type doping, or N to induce n-type doping, larger atomic radii atoms including Ge and Sn, V, and some lanthanides may be included to modify surface energies, and change the resultant crystal lattice parameter size, or introduce deep level electrical defects.

Figure 9:
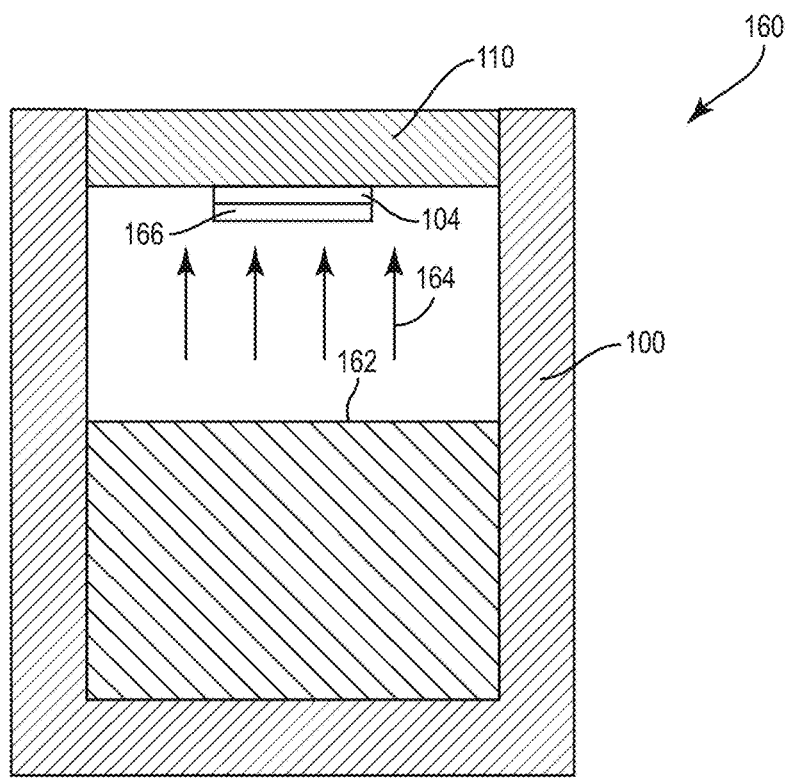
FIG. 9 is a cross-sectional illustration of a SiC growth system that includes a source material that is configured to provide an oversaturated amount of vapor flux to the seed.

FIG. 9 is a cross-sectional illustration of a SiC growth system 160 that includes a source material 162 that is configured to provide an oversaturated amount of vapor flux 164 to the seed 104 than what is necessary for crystalline growth. In certain embodiments, the source material 162 may comprise a higher density than the source material 102 of FIG. 8. In this regard, increased amounts of the vapor flux 164 may be provided to the seed 104 for otherwise similar growth conditions. In other embodiments, the source material 162 may comprise a similar density to the source material 102 of FIG. 8, and the increased amounts of the vapor flux 164 may be provided by changing one or more growth conditions such as temperature and pressure. For example, the overall temperature within the crucible 100 may be increased or the temperature of the source material 162 may be increased relative to the seed 104. In certain embodiments, the growth pressure within the crucible 100 may be decreased to provide increased vapor flux 164. Additionally, increased vapor flux 164 may be provided by one or more combinations of increasing the density of the source material 162, increasing growth temperatures, and decreasing growth pressures as described above. Since the vapor flux 164 is provided in an oversaturated manner, parasitic deposition may occur within the crucible 100 away from the seed 104, or some vapor flux 164 may exit through exhaust of the SiC growth system 160 without deposition or sublimation. By providing oversaturation of the vapor flux 164, a SiC crystal 166 may form that has reduced defect densities than the SiC crystal 112 of FIG. 8, particularly as the SiC crystal 166 continues to grow further away from the seed 104.

Figure 10:
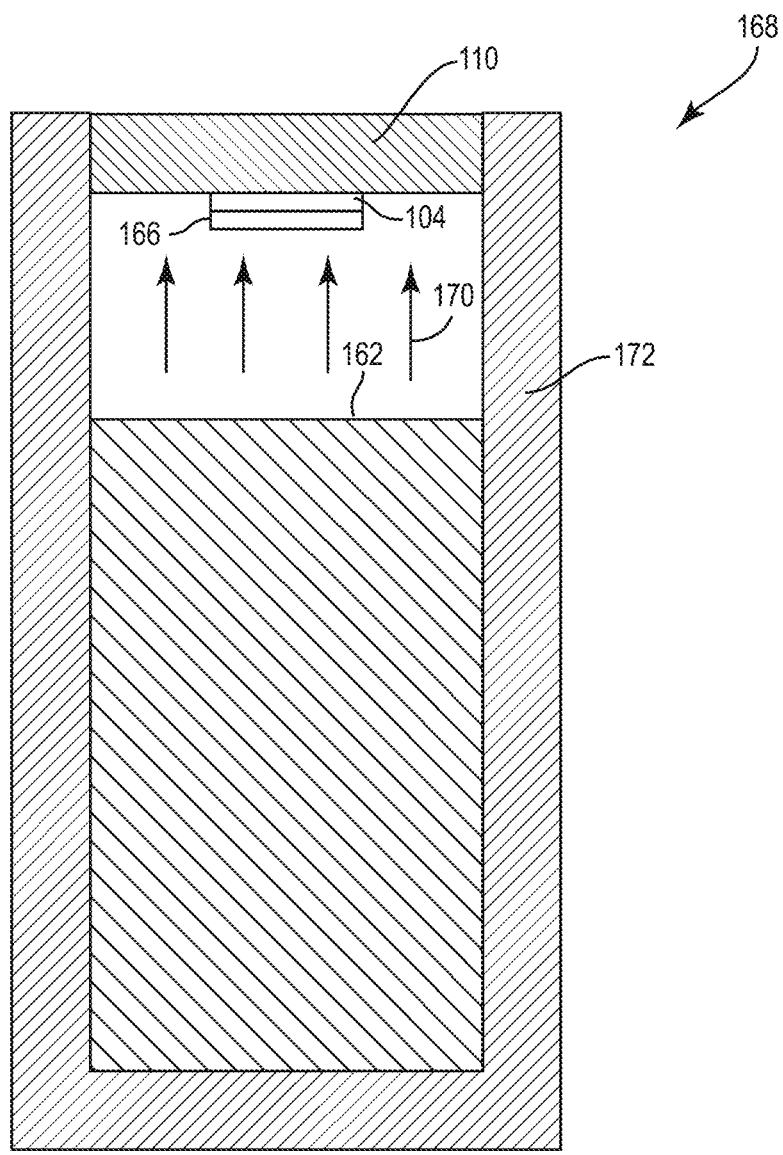
FIG. 10 is a cross-sectional illustration of a SiC growth system that is configured to provide an oversaturated amount of vapor flux to the seed with a taller crucible than the SiC growth system of FIG. 8.

FIG. 10 is a cross-sectional illustration of a SiC growth system 168 that is configured to provide an oversaturated amount of vapor flux 170 to the seed 104 with a taller crucible 172 than the crucible 100 of the SiC growth system 156 of FIG. 8. As illustrated, the amount of the source material 162 may be increased relative to the seed 104 by providing the crucible 172 with taller dimensions. In this regard, the overall volume of the source material 162 may be increased relative to the seed 104 to provide an increased amount of the vapor flux 170. In certain embodiments, the source material 162 may comprise the same density as the source material 102 of FIG. 8. In certain embodiments, the amount of the vapor flux 170 may further be increased by providing by one or more combinations of increasing the density of the source material 162, increasing growth temperatures, and decreasing growth pressures as described for FIG. 9.

Figure 11:
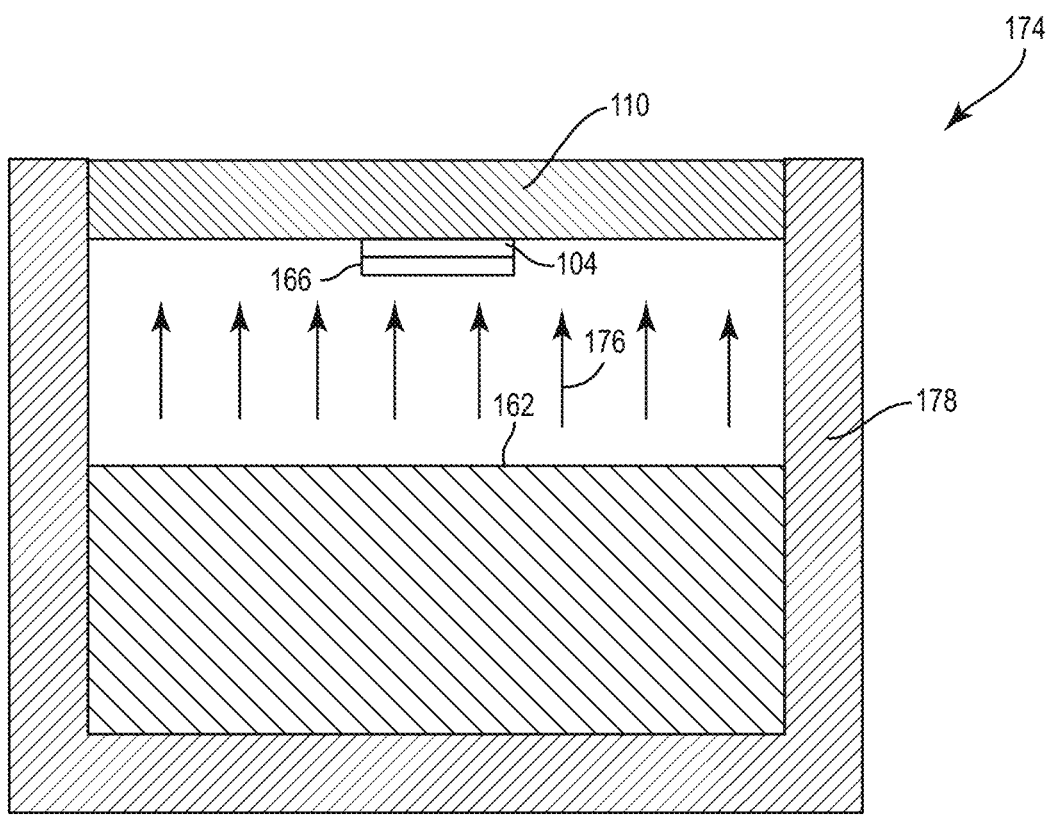
FIG. 11 is a cross-sectional illustration of a SiC growth system that is configured to provide an oversaturated amount of vapor flux to the seed with a wider crucible than the SiC growth system of FIG. 8.

FIG. 11 is a cross-sectional illustration of a SiC growth system 174 that is configured to provide an oversaturated amount of vapor flux 176 to the seed 104 with a wider crucible 178 than the crucible 100 of the SiC growth system 156 of FIG. 8. As illustrated, the amount of the source material 162 may be increased relative to the seed 104 by providing the crucible 178 with wider dimensions. In a similar manner to the taller crucible 172 of FIG. 10, the overall volume of the source material 162 may be increased relative to the seed 104 to provide an increased amount of the vapor flux 176. In certain embodiments, the source material 162 may comprise the same density as the source material 102 of FIG. 8. In certain embodiments, the amount of the vapor flux 176 may further be increased by providing one or more combinations of increasing the density of the source material 162, increasing growth temperatures, and decreasing growth pressures as described for FIG. 9.

Figure 12A:
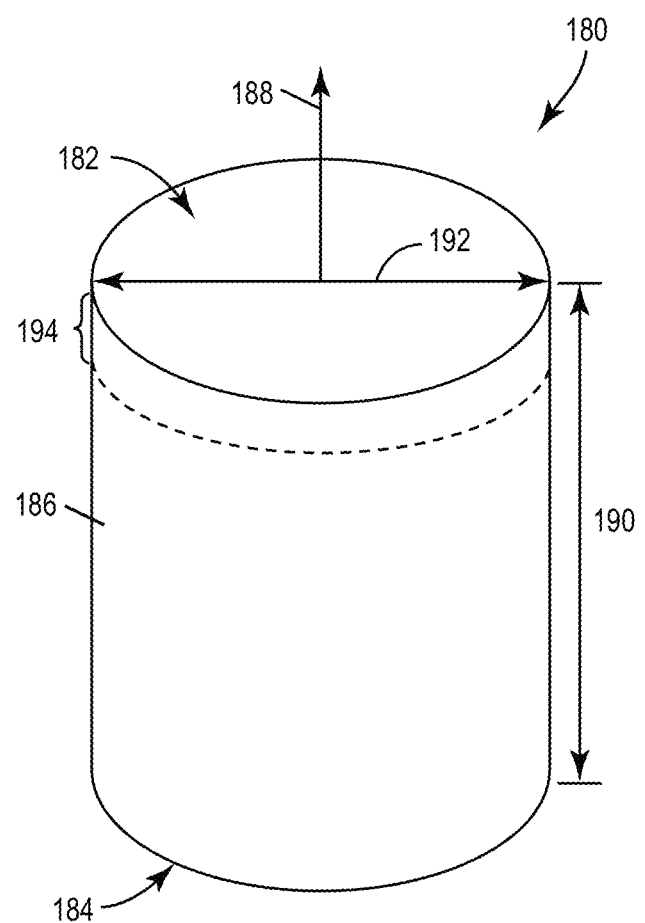
FIG. 12A is a perspective view of an exemplary SiC crystal boule according to embodiments disclosed herein.

FIG. 12A is a perspective view of an exemplary SiC crystal boule 180 according to embodiments disclosed herein. As illustrated, the SiC crystal boule 180 includes a first end face 182, a second end face 184 that is opposite the first end face 182, a side surface 186 therebetween and along a periphery of the SiC crystal boule 180 that may form a generally cylindrical shape, and a central axis 188. Depending on the application, the first end face 182 may correspond to the crystallographic c-plane and the central axis 188 may correspond with the [0001] direction. In other embodiments, the first end face 182 may correspond to an off-axis plane relative to the crystallographic c-plane or the first end face 182 may correspond to other crystallographic planes of SiC. During growth, the second end face 184 is initially grown closest to the seed (e.g., 104 of FIG. 9) and the remaining portion of the SiC crystal boule 180 is grown in a direction away from the seed (e.g., 104 of FIG. 9). A boule length or height 190 may be measured from the second end face 184 to the first end face 182, and a boule diameter 192 may be measured across the first end face 182. In FIG. 12A, a curved dashed line is superimposed on the SiC crystal boule 180 to indicate the location of an exemplary SiC wafer 194 that may be separated from the SiC crystal boule 180.

During crystal growth, various structural defects including dislocations (e.g., micropipes, threading edge, threading screw and/or basal plane dislocations), hexagonal voids, and stacking faults, among others may form in the material composition of the SiC crystal boule 180. As described herein, TDD, or total dislocation density, may be defined as a total count of all micropipes and other dislocations (e.g., threading edge, threading screw and/or basal plane dislocations) for a given area of SiC material. In order to quantify TDD counts for a given area or region of the SiC crystal boule 180, defect characterization is performed on one or more SiC wafers that are separated from the SiC crystal boule 180. In further embodiments, multiple SiC wafers from different vertical portions of the SiC boule 180 may be quantified to provide a TDD profile for the SiC boule 180 as a whole. In certain embodiments, synchrotron x-ray topography (SXRT) may be used to characterize TDD values; however, SXRT may not always be practical in manufacturing environments where quicker results are typically needed. Etch-based dislocation characterization is more commonly used to provide faster results across larger wafer areas, but the interpretation of etch-based results can be less precise than that of SXRT. For example, in some etch-based dislocation characterization techniques, etching can merge closely spaced micropipes so that two or more actual micropipes are counted and reported as a single micropipe. In this regard, many existing literature reports may under-report actual TDD values for SiC materials. To insure accurate etch-based dislocation characterization results, etch protocols have been developed that generate recognizable and unique features associated with each dislocation type.

Etching SiC reveals features such as etch pits that can be recognized and correlated to other characterization methods such as SXRT. Etch-based characterization may be accomplished by delineating etch pits, identifying corresponding defect types, and counting them manually, or with automated microscopy tools. Wafer etching effectively destroys usable wafer area, is expensive, requires corrosive chemistries, and requires constant attention to maintain a viable process. In this regard, only a few sacrificial wafers per boule are typically sampled in practice. By way of example, to perform defect characterization on a SiC wafer, the carbon face (C-face) of the SiC wafer may be etched to highlight extended defects and the SiC wafer is subsequently imaged. For example, an n-type doped SiC wafer ($\sim$>$10^{17}$ cm$^2$) may be etched in a molten salt (KOH/EOH) before the SiC wafer is scanned and imaged for defect detection. The observed etch pits and defects are then identified for dislocation type manually, or by automated defect recognition, and counted for reporting. An optical scanner, or a manual or automatic optical microscope, may be used for defect counting from the image. For material that is not doped appropriately (low doped n-type, or insulating and p-type), this method may not work, due to insufficient delineation of defects by the etch method. Additionally, the silicon face (Si-face) of the SiC wafer may also be etched to delineate etch features from the Si-face. Si-face etching may provide more accurate counting of micropipes and basal plane dislocations while C-face etching may provide more accurate counting of threading screw dislocations. In this manner, improved accuracy for etch-based dislocation characterization of TDD should include combinations of identified defect counts from both the C-face and the Si-face of a representative SiC wafer. Further discussion of etch-based characterization protocols for accurate TDD counts may be found in "Dislocation Characterization in 4H-SiC Crystals" by Sumakeris et al. as published in the Materials Science Forum 858 (2016) 393. Another characterization technique that may be used to characterize TDD values in SiC wafers may include analyzing nondestructive images of SiC wafers with a deep convolutional neural network (DCNN) that has been trained for defect identification with destructively etched wafer images, as set out in U.S. patent application Ser. No. 16/750,358, filed Jan. 23, 2020, now U.S. patent publication No. 2020/0365685 A1, published Nov. 19, 2020, entitled "NONDESTRUCTIVE CHARACTERIZATION FOR CRYSTALLINE WAFERS," with the entire contents thereof being hereby incorporated by reference herein.

Figure 12B:
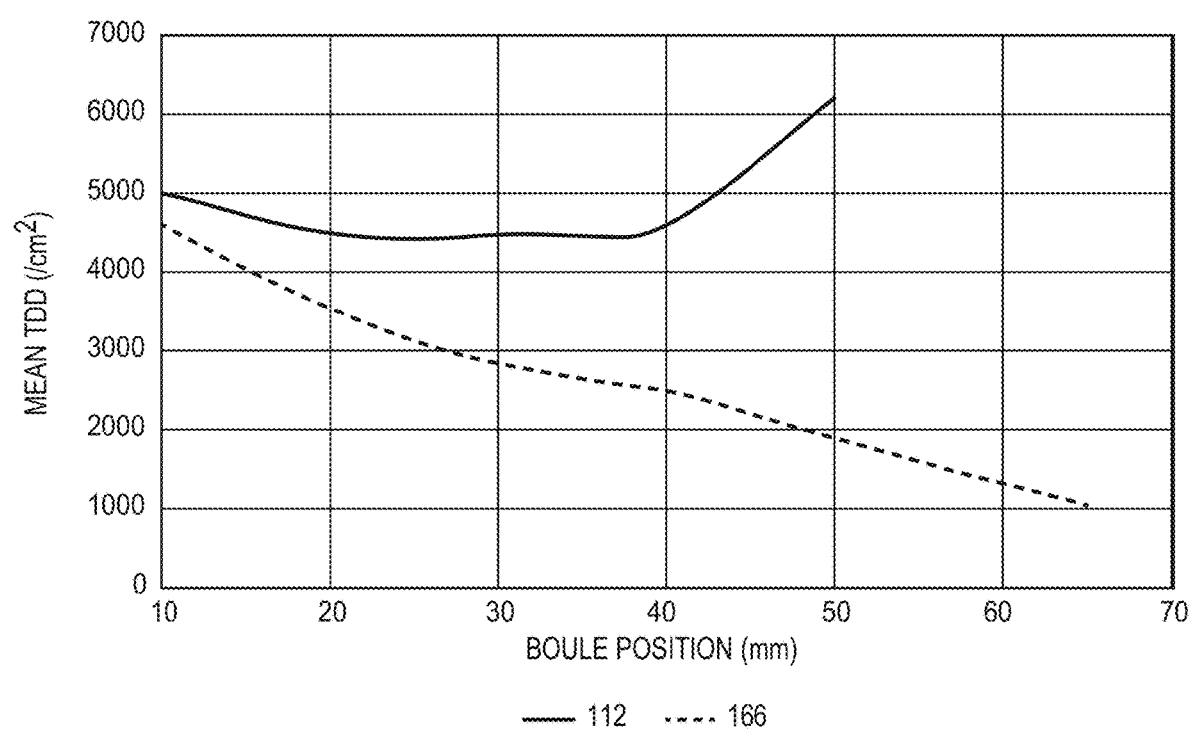
FIG. 12B is a comparison plot illustrating differences in mean total dislocation density (TDD) by boule position for crystalline SiC grown as described for the SiC crystal of FIG. 8 and the oversaturated growth conditions of the SiC crystal of FIG. 9.

FIG. 12B is a comparison plot illustrating differences in mean TDD values by boule position for crystalline SiC grown as described for the SiC crystal 112 of FIG. 8 and the oversaturated growth conditions of the SiC crystal 166 of FIG. 9. In both data sets, the SiC crystals 112, 166 comprise 4H-SiC materials. The x-axis represents the corresponding boule position in mm from which the SiC wafers were taken and the boule position is measured as the distance from the seed from which the boule was grown. The data set provided for the SiC crystal 112 includes data from a representative number of SiC boules grown with boule diameters of approximately 150 mm. For comparison purposes, a representative number of SiC boules with boule diameters of approximately 150 mm were grown according to the growth conditions of the SiC crystal 166. The y-axis represents mean TDD value in square centimeter (cm$^2$) for SiC wafers provided at each of the corresponding boule positions. For each individual SiC wafer, the TDD was determined for a wafer area that includes a center of the SiC wafer and is radially bounded by a radial wafer position of 2 mm from a perimeter edge of the SiC wafer. As illustrated, data sets for both SiC crystals 112, 166 demonstrate increased mean TDD values for lower boule positions (e.g., 10 mm) that are grown closer to seeds. As the boules initially grow farther away from the seeds (e.g., 10 mm to about 20 mm), both data sets show mean TDD values that generally decrease. At a boule position of about 40 mm, the data set for the SiC crystal 112 demonstrates a sharp increase in mean TDD values, thereby providing limited boule heights, while the data set for the SiC crystal 166 demonstrates a continued decline in mean TDD values as the boule position approaches 70 mm. Additionally, the data set for the SiC crystal 166 provides notably lower mean TDD values compared to the data set for the SiC crystal 112 for all common boule positions (e.g., 10 to 50 mm) in addition to the continued decline in mean TDD values for higher boule positions (e.g., above 50 mm to 65 mm). By way of example, an individual SiC boule that is included in the data set for the SiC crystal 166 includes a TDD value of 4572 per cm$^2$ at a boule position of 8.3 mm, a TDD value of 2529 per cm$^2$ at 24.3 mm, and a TDD value of 1611 per cm$^2$ at 41.5 mm. In this regard, for a boule height of greater than or equal to 40 mm, at least 40%, or at least 50%, or at least 75%, or at least 80% of the height of the individual SiC boule is configured to provide a plurality of SiC wafers and each SiC wafer of the plurality of SiC wafers comprises a TDD of less than or equal to 4600 per cm$^2$, or in a range including 1000 per cm$^2$ and 4600 per cm$^2$. Additionally, at least 40% of the height of the individual SiC boule is configured to provide a plurality of SiC wafers and each SiC wafer of the plurality of SiC wafers comprises a TDD of less than or equal to 3000 per cm$^2$, or in a range including 1000 per cm$^2$ and 3000 per cm$^2$. In certain embodiments, the oversaturated growth conditions for the SiC crystal 166 may be applied to produce boule heights as high as 300 mm with notably lower mean TDD values. In certain embodiments, the boule heights are in a range including 60 mm to 300 mm, or in a range including 55 mm to 80 mm, or in a range including 60 mm to 80 mm, or in a range including 60 mm to 70 mm, or in range that is greater than 50 mm and less than or equal to 65 mm, or greater than or equal to 55 mm and less than or equal to 65 mm. In certain embodiments, the boule diameters described above are in a range including 145 mm to 180 mm. As further illustrated in FIG. 12B, a SiC wafer that is taken from a boule position of greater than or equal to 40 mm may comprise a TDD of less than or equal to 3500 per cm$^2$. For such TDD values, the boule position may be in a range comprising 40 mm and 300 mm, or 40 mm and 80 mm, or 50 mm and 65 mm, or 60 mm and 300 mm, or 60 mm and 80 mm. The TDD values may be as low as 500 per cm$^2$, or lower, depending on the embodiments. The SiC wafer may further comprise a TDD of less than or equal to 2500 per cm$^2$, or less than or equal to 1500 per cm$^2$.

Figure 13A:
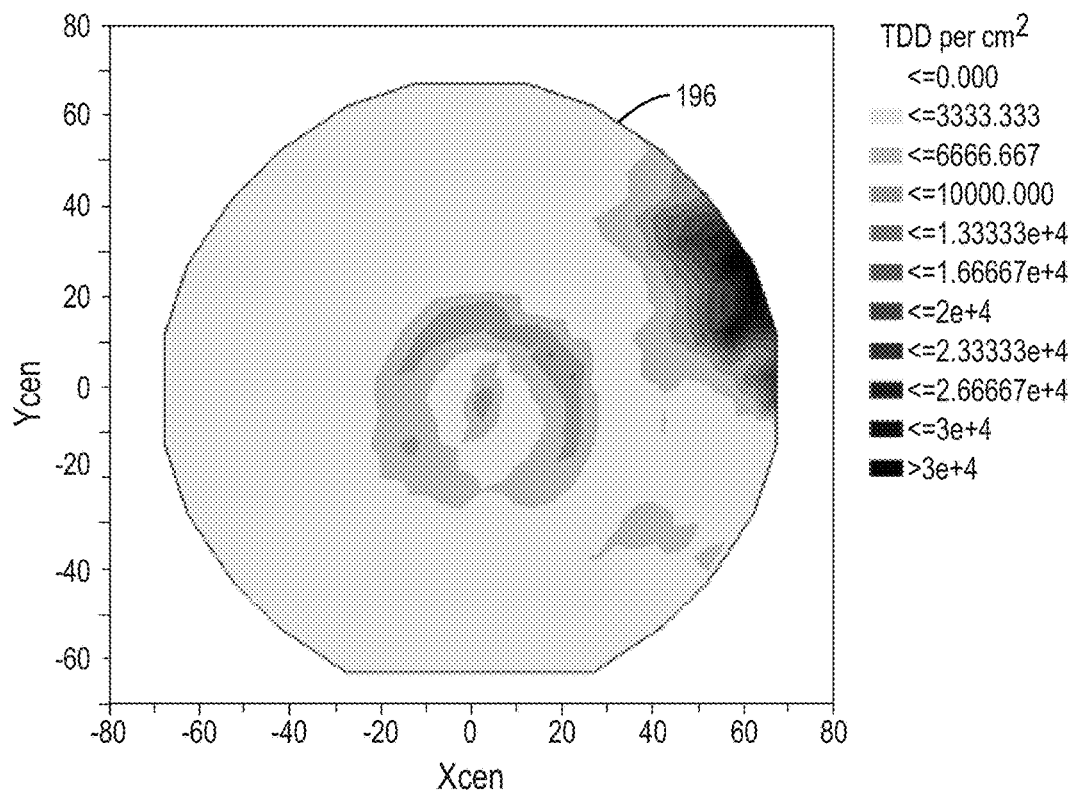
FIG. 13A is a contour plot illustrating TDD values for a SiC wafer grown as described for the SiC crystal of FIG. 8.
Figure 13B:
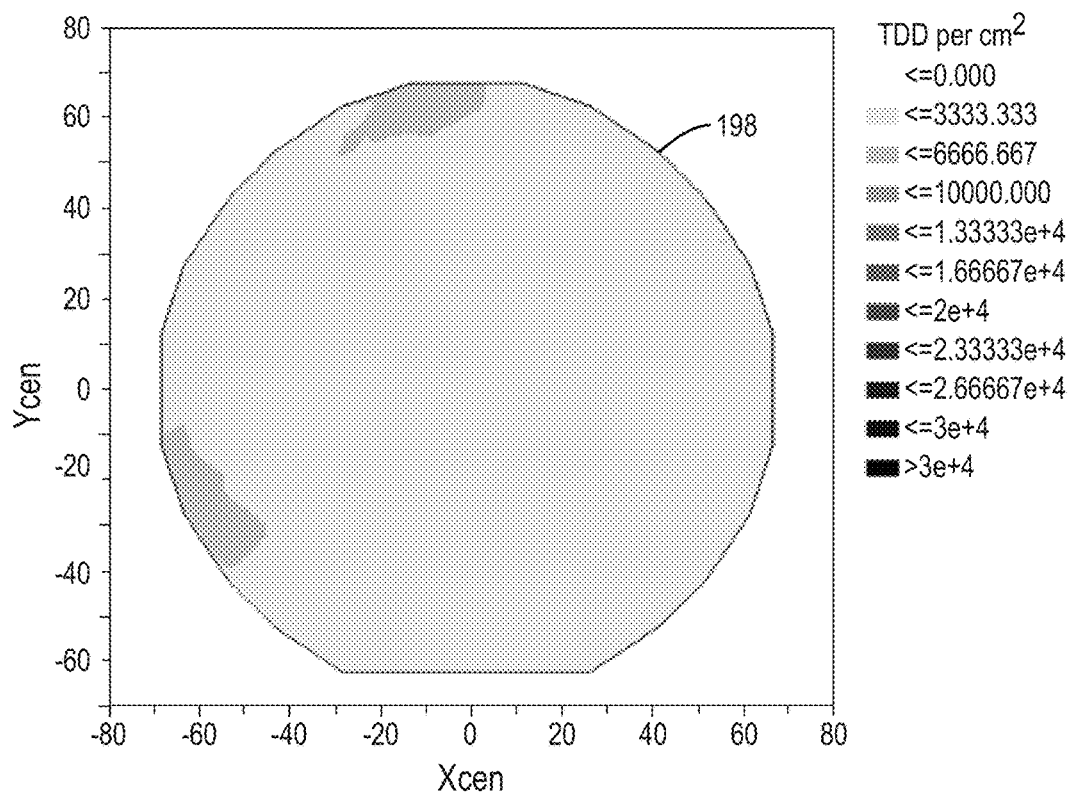
FIG. 13B is a contour plot illustrating TDD values for a SiC wafer grown as described for the oversaturated growth conditions of the SiC crystal of FIG. 9.

FIG. 13A is a contour plot illustrating TDD values for a SiC wafer 196 grown as described for the SiC crystal 112 of FIG. 8. For comparison, FIG. 13B is a contour plot illustrating TDD values for a SiC wafer 198 grown as described for the oversaturated growth conditions of the SiC crystal 166 of FIG. 9. For the purposes of the comparison, the SiC wafers 196, 198 were selected with a diameter of approximately 150 mm. In this manner, the x-axis and the y-axis for both contour plots in FIG. 13A and FIG. 13B are illustrated in + and − mm values where 0 mm represents a center point for the SiC wafers 196, 198. The SiC wafers 196, 198 were taken from their respective boules at locations near the ends of the boules that were formed farthest from seeds during growth. In FIGS. 13A and 13B, the contour scales for TDD values are intentionally kept the same for comparison purposes. The results provided in FIGS. 13A and 13B are determined by an x-y mapping methodology that defines a grid of 5 mm by 5 mm square regions across the wafer. Four of such square regions are arranged to be registered with the radial center of the wafer. Exclusions regions including a 2 mm perimeter region from the wafer edge and additional areas corresponding to major and/or minor wafer flats are not counted. As illustrated, the SiC wafer 196 demonstrates noticeably increased TDD regions near the wafer center and along portions of the wafer perimeter. With the same scale, the TDD values for the SiC wafer 198 are almost undetectable in FIG. 13B. In this regard, the SiC wafer 198 of FIG. 13B demonstrates significantly lower and more uniform TDD values across the wafer area than the SiC wafer 196 of FIG. 13A.

Figure 13C:
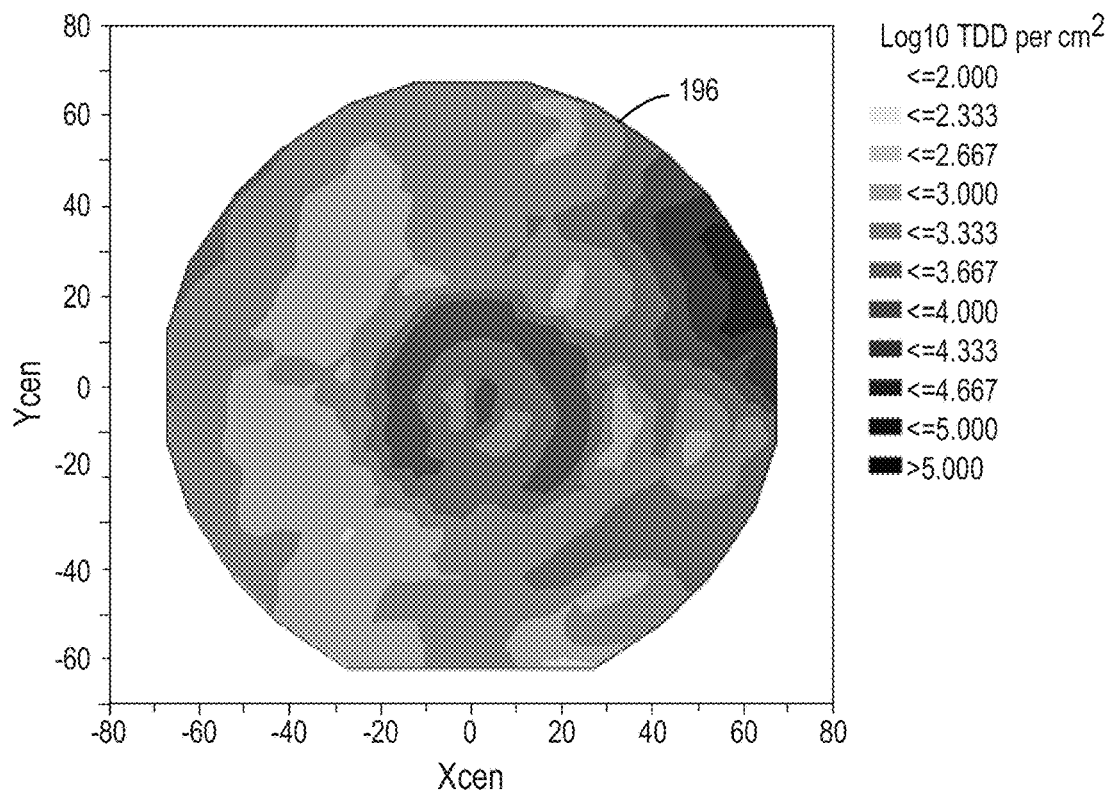
FIG. 13C is the contour plot of FIG. 13A with TDD values redrawn in a log 10 scale.
Figure 13D:
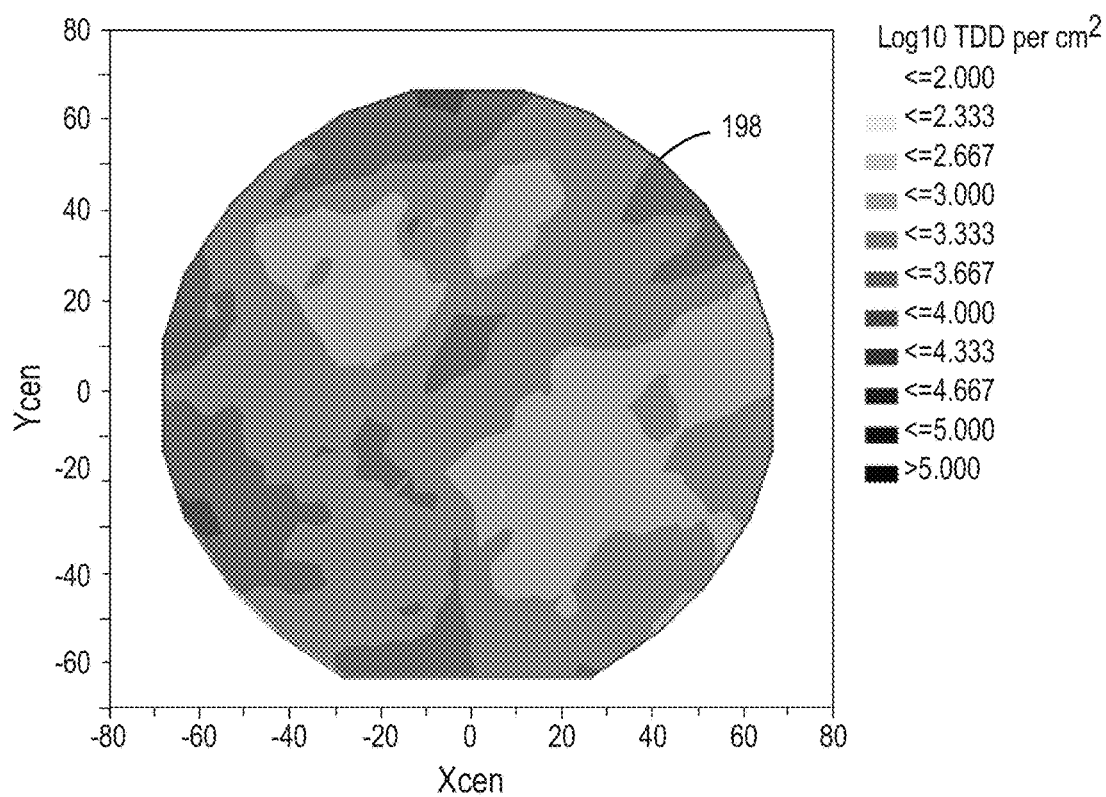
FIG. 13D is the contour plot of FIG. 13B with TDD values redrawn in the same log 10 scale as FIG. 13C.

FIGS. 13C and 13D respectively illustrate the contour plots of FIGS. 13A and 13B with TDD values redrawn in a log 10 scale. As illustrated, the contour plot of FIG. 13C demonstrates the same sharply higher TDD regions near the wafer center and along portions of the wafer perimeter. In FIG. 13D, the log 10 scale provides improved visibility of TDD variations for the SiC wafer 198. Notably, uniformity is significantly improved as the SiC wafer 198 is devoid of any sharply higher TDD regions.

Figure 14A:
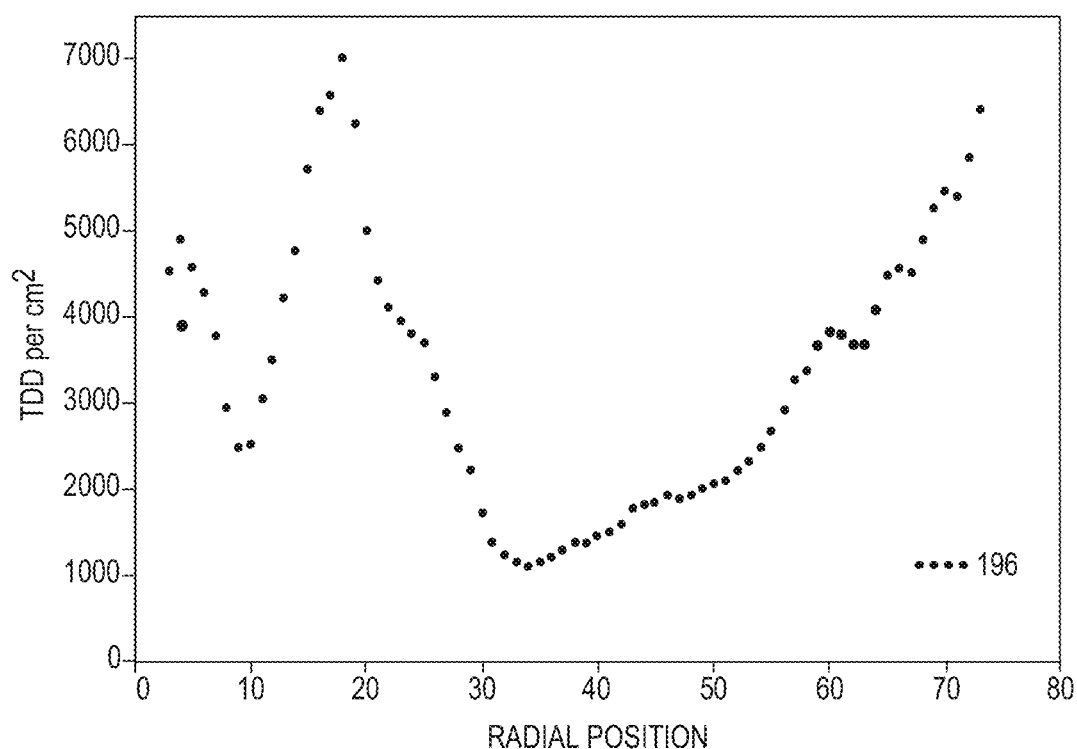
FIG. 14A is a plot illustrating total TDD values by radial position across the SiC wafer of FIG. 13A.
Figure 14B:
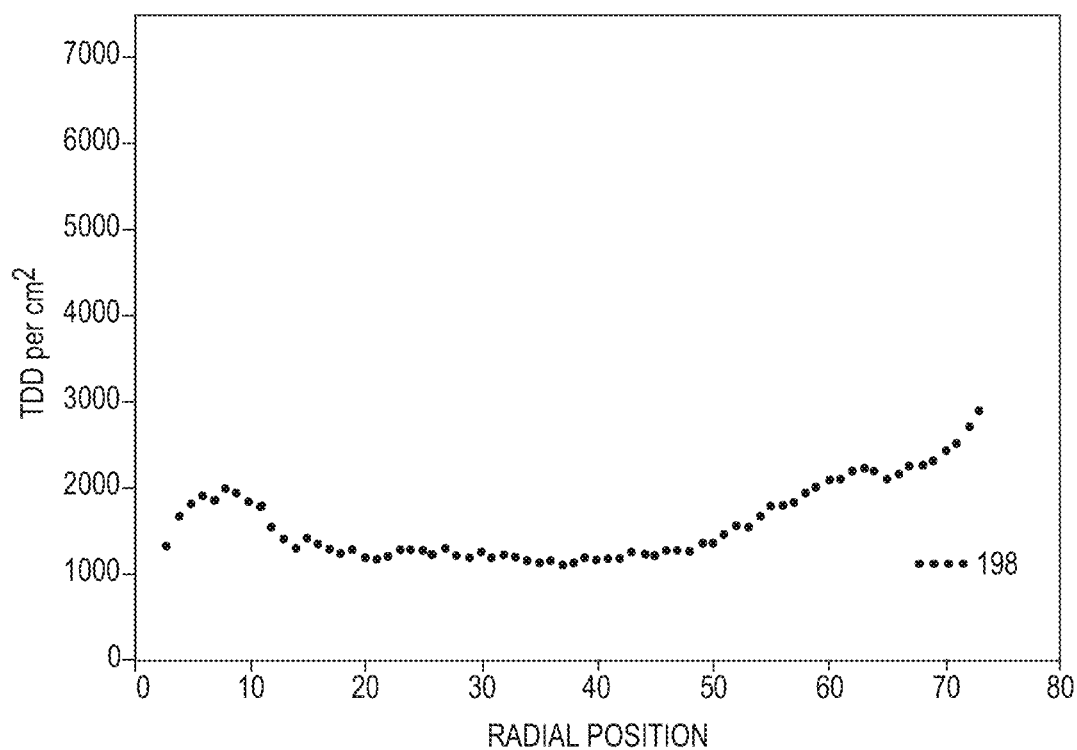
FIG. 14B is a plot illustrating total TDD values by radial position across the SiC wafer of FIG. 13B.

FIG. 14A is a plot illustrating TDD values by radial position across the SiC wafer 196 of FIG. 13A. For comparison, FIG. 14B is a plot illustrating TDD values by radial position across the SiC wafer 198 of FIG. 13B. In each of FIG. 14A and FIG. 14B, the y-axis represents TDD in $cm^2$ while the x-axis represents radial wafer position in mm where a value of 0 corresponds to a wafer center and a value of 75 corresponds to a wafer edge. The results provided in FIG. 14A are determined by a radial mapping methodology where the radial wafer position indicates the outer diameter (in mm) of an annular ring and a width of the annular ring from the outer diameter is set at 1 mm. An exception is that the radial wafer position of 3 mm corresponds to a circle inclusive of the wafer center (0 mm) since an annular ring in such position may have too small of an area for accurate results. Another exception is that portions of outer radial wafer positions that are encroached by exclusion regions corresponding to major and/or minor wafer flats are not counted.

In FIG. 14A, the TDD values show sharp peaks above 4500 per $cm^2$ for radial positions between 0 mm (wafer center) and 10 mm, above 6000 per $cm^2$ for radial positions between 10 mm and 25 mm, and also above 6000 per $cm^2$ for radial positions from 60 mm to 75 mm (wafer edge). In FIG. 14B, the SiC wafer 198 demonstrates TDD values that are no higher than 5000 per $cm^2$, or no higher than 4000 per $cm^2$, or no higher than 3000 per $cm^2$, or no higher than 2500 per $cm^2$, or in a range including 1000 per $cm^2$ and 4000 per $cm^2$ for any radial position in a range including 3 mm and 50 mm from the wafer center, or in a range including 3 mm and 70 mm, or for any radial position of the SiC wafer 198 in a range including 3 mm from the wafer center and 2 mm from a perimeter edge of the wafer. In FIG. 14B, TDD data is provided to a radial position of 73 mm to account for a 2 mm exclusion ring at the perimeter edge. In certain embodiments, the TDD values are no higher than 3000 per $cm^2$, or 2500 per $cm^2$, or in a range including 1000 per $cm^2$ and 3000 per $cm^2$ for any radial position within 50 mm, or within 70 mm of the center of the SiC wafer 198. Notably, the SiC wafer 198 demonstrates a TDD that is less than or equal to 2000 per $cm^2$ for any radial positions between and including 10 mm and 57 mm. Stated differently, the TDD is less than or equal to 2000 per $cm^2$ for any annular ring comprising a 1 mm width and the outer diameter corresponding to the radial wafer position for at least 50% or at least 60% of all radial positions of the SiC wafer 198. Furthermore, the SiC wafer 198 demonstrates a TDD that is less than or equal to 1500 per $cm^2$ for any radial positions between and including 13 mm and 50 mm. Stated differently, the TDD is less than or equal to 1500 per $cm^2$ for any annular ring comprising a 1 mm width and the outer diameter corresponding to the radial wafer position for at least 40% or at least 50% of all radial positions of the SiC wafer 198.

As disclosed herein, oversaturated growth conditions for SiC crystals may provide SiC boules and resulting SiC wafers that have TDD distributions with significantly improved uniformity. One way to characterize TDD uniformity includes quantifying a coefficient of variation for the TDD that is defined as a ratio of the standard deviation to the mean TDD value for a particular SiC wafer. In this regard, the coefficient of variation for TDD may indicate the extent of TDD variability in relation to the mean TDD. By way of example, the SiC wafer 196 as represented in the plots of FIGS. 13A, 13C, and 14A, has a calculated TDD standard deviation of 1576 per $cm^2$ and a mean TDD value of 3338 per $cm^2$ for a wafer area that is divided into annular rings with 1 mm widths and the wafer area is bounded by a radial wafer position of 3 mm from a center of the SiC wafer 196 and 2 mm from a perimeter edge of the SiC wafer 196. In this regard, the coefficient of variation for TDD of the SiC wafer 196 is 0.472. For comparison, the SiC wafer 198 as represented in the plots of FIGS. 13B, 13D, and 14B, has a calculated TDD standard deviation of 449 per $cm^2$ and a mean TDD value of 1612 per $cm^2$ for a wafer area that is divided into annular rings with 1 mm widths and the wafer area is bounded by a radial wafer position of 3 mm from a center of the SiC wafer 198 and 2 mm from a perimeter edge of the SiC wafer 198. As such, the coefficient of variation for TDD of the SiC wafer 198 is 0.28, demonstrating a significantly more uniform distribution of TDD when SiC boules are grown according to the oversaturated growth conditions described above. In certain embodiments, the coefficient of variation is less than or equal to 0.2, or in a range of greater than or equal to 0.1 and less than or equal to 0.3. Another way to characterize TDD uniformity may include simply characterizing the standard deviation values for each SiC wafer.

While the above examples are provided for SiC wafers having diameters of approximately 150 mm, exemplary embodiments are also applicable to SiC wafers having other diameters, including less than or greater than approximately 150 mm. In certain embodiments, SiC wafers may include diameters of approximately 200 mm, or approximately 300 mm, or approximately 450 mm. Exemplary embodiments are applicable to other polytypes of SiC in addition to the 4H-SiC examples provided, including but not limited to 6H-SiC. As previously described, embodiments disclosed herein are applicable to both doped crystalline semiconductor materials (e.g., N-doped conductive SiC and/or P-doped SiC), co-doped, and/or undoped crystalline semiconductor materials (e.g., semi-insulating SiC or high resistivity SiC).

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A silicon carbide (SiC) wafer comprising a diameter of at least 145 millimeters (mm) and a total dislocation density (TDD) of less than or equal to 3000 per square centimeter ($cm^2$) for any annular ring comprising a 1 mm width and an outer diameter corresponding to a radial wafer position in a range from 3 mm and 50 mm from a center of the SiC wafer, wherein the TDD is a total count of micropipes, threading edge dislocations, threading screw dislocations, and basal plane dislocations.

2. The SiC wafer of claim 1, wherein the TDD is less than or equal to 3000 per $cm^2$ for any annular ring comprising a 1 mm width and the outer diameter corresponding to a radial wafer position in a range from 3 mm from the center of the SiC wafer and 2 mm from a perimeter edge of the SiC wafer.

3. The SiC wafer of claim 1, wherein the TDD is less than or equal to 2500 per $cm^2$ for any annular ring comprising a 1 mm width and the outer diameter corresponding to the radial wafer position in the range from 3 mm and 50 mm of the center of the SiC wafer.

4. The SiC wafer of claim 1, wherein the TDD is less than or equal to 2000 per $cm^2$ for any annular ring comprising a 1 mm width and the outer diameter corresponding to the radial wafer position for at least 50% of all radial wafer positions of the SiC wafer.

5. The SiC wafer of claim 1, wherein the TDD is less than or equal to 1500 per $cm^2$ for any annular ring comprising a 1 mm width and the outer diameter corresponding to the radial wafer position for at least 50% of all radial positions of the SiC wafer.

6. The SiC wafer of claim 1, wherein the diameter is in a range from 145 mm to 205 mm.

7. The SiC wafer of claim 1, wherein the diameter is in a range from 145 mm to 155 mm.

8. The SiC wafer of claim 1, wherein the SiC wafer comprises a 4H-SiC wafer.

9. The SiC wafer of claim 1, wherein the SiC wafer comprises semi-insulating SiC.

10. The SiC wafer of claim 1, wherein the SiC wafer comprises n-type SiC.

11. The SiC wafer of claim 1, wherein the TDD is greater than or equal to 1000 $cm^2$.

12. A silicon carbide (SiC) wafer comprising a diameter of at least 145 millimeters (mm) and a coefficient of variation for total dislocation density (TDD) of less than or equal to 0.3 for a wafer area that is divided into annular rings with 1 mm widths wherein the wafer area is bounded by a radial wafer position of 3 mm from a center of the SiC wafer and 2 mm from a perimeter edge of the SiC wafer, wherein the coefficient of variation is defined as a ratio of a standard deviation to the mean TDD for the annular rings, and the TDD is a total count of micropipes, threading edge dislocations, threading screw dislocations, and basal plane dislocations.

13. The SiC wafer of claim 12, wherein the coefficient of variation is less than or equal to 0.2.

14. The SiC wafer of claim 12, wherein the coefficient of variation is greater than or equal to 0.1.

15. The SiC wafer of claim 12, wherein the TDD is less than or equal to 3000 per square centimeter ($cm^2$) for any annular ring comprising a 1 mm width and an outer diameter corresponding to a radial wafer position in a range from 3 mm and 50 mm of the center of the SiC wafer.

16. The SiC wafer of claim 12, wherein the TDD is less than or equal to 2000 per square centimeter ($cm^2$) for any annular ring comprising a 1 mm width and an outer diameter corresponding to the radial wafer position for at least 50% of all radial wafer positions of the SiC wafer.

17. The SiC wafer of claim 12, wherein the SiC wafer comprises a 4H-SiC wafer.

18. The SiC wafer of claim 12, wherein the SiC wafer comprises semi-insulating SiC.

19. The SiC wafer of claim 12, wherein the SiC wafer comprises n-type SiC.

20. The SiC wafer of claim 12, wherein the diameter is in a range from 145 mm to 155 mm.

21. The SiC wafer of claim 12, wherein the diameter is in a range from 145 mm to 205 mm.

22. A silicon carbide (SiC) boule comprising a diameter in a range from 145 millimeters (mm) to 180 mm and a boule height greater than 50 mm, wherein at least 75% of the height of the SiC boule is configured to provide a plurality of first SiC wafers and each first SiC wafer of the plurality of first SiC wafers comprises a total dislocation density (TDD) of less than or equal to 4600 per square centimeter ($cm^2$) for a wafer area that includes a center of the first SiC wafer and is radially bounded by a radial wafer position of 2 mm from a perimeter edge of the first SiC wafer, and wherein the TDD is a total count of micropipes, threading edge dislocations, threading screw dislocations, and basal plane dislocations.

23. The SiC boule of claim 22, wherein the TDD is greater than or equal to 1000 per $cm^2$.

24. The SiC boule of claim 22, wherein at least 40% of the height of the SiC boule is configured to provide a plurality of second SiC wafers and each second SiC wafer of the plurality of second SiC wafers comprises a TDD of less than or equal to 3000 $cm^2$ for a wafer area that includes a center of the second SiC wafer and is radially bounded by a radial wafer position of 2 mm from a perimeter edge of the second SiC wafer.

25. The SiC boule of claim 24, wherein the TDD is greater than or equal to 1000 per $cm^2$.

26. The SiC boule of claim 22, wherein the boule height is in a range from 60 mm to 300 mm.

27. The SiC boule of claim 22, wherein the boule height is in a range from 55 mm to 80 mm.

28. The SiC boule of claim 22, wherein the boule height is in a range from 60 mm to 70 mm.

29. The SiC boule of claim 22, wherein the boule height is less than or equal to 65 mm.

30. The SiC boule of claim 22, wherein the boule height is greater than or equal to 55 mm and less than or equal to 65 mm.

31. A silicon carbide (SiC) boule comprising a diameter in a range from 145 millimeters (mm) to 180 mm and a boule height greater than or equal to 40 mm, wherein at least 50% of the height of the SiC boule is configured to produce a plurality of first SiC wafers and each first SiC wafer of the plurality of first SiC wafers comprises a total dislocation density (TDD) of less than or equal to 4600 per square centimeter ($cm^2$) for a wafer area that includes a center of the first SiC wafer and is radially bounded by a radial wafer position of 2 mm from a perimeter edge of the first SiC wafer, and wherein the TDD is a total count of micropipes, threading edge dislocations, threading screw dislocations, and basal plane dislocations.

32. The SiC boule of claim 31, wherein the boule height is in a range from 40 mm to 300 mm.

33. The SiC boule of claim 31, wherein the boule height is in a range from 40 mm to 80 mm.

34. The SiC boule of claim 31, wherein the TDD is greater than or equal to 1000 per cm$^2$.

35. The SiC boule of claim 31, wherein at least 80% of the height of the SiC boule is configured to produce the plurality of first SiC wafers comprising a mean TDD of less than or equal to 4600 per cm$^2$.

36. The SiC boule of claim 31, wherein at least 40% of the height of the SiC boule is configured to produce a plurality of second SiC wafers and each second SiC wafer of the plurality of second SiC wafers comprises a mean TDD of less than or equal to 3000 per cm$^2$ for a wafer area that includes the center of the second SiC wafer and is radially bounded by a radial wafer position of 2 mm from the perimeter edge of the second SiC wafer.

37. The SiC boule of claim 36, wherein the TDD is greater than or equal to 1000 per cm$^2$.

38. A silicon carbide (SiC) wafer comprising a total dislocation density (TDD) of less than or equal to 3500 per square centimeter (cm$^2$) for a wafer area that includes a center of the SiC wafer and is radially bounded by a radial wafer position of 2 millimeters (mm) from a perimeter edge of the SiC wafer, wherein the SiC wafer is taken from a boule position of greater than or equal to 40 mm as measured from a seed, wherein the TDD is a total count of micropipes, threading edge dislocations, threading screw dislocations, and basal plane dislocations.

39. The SiC wafer of claim 38, wherein the boule position is in a range from 40 mm and 300 mm.

40. The SiC wafer of claim 38, wherein the boule position is in a range from 40 mm and 80 mm.

41. The SiC wafer of claim 38, wherein the boule position is in a range from 40 mm and 65 mm.

42. The SiC wafer of claim 41, wherein the TDD is greater than or equal to 500 per cm$^2$.

43. The SiC wafer of claim 38, wherein the TDD is greater than or equal to 500 per cm$^2$.

44. The SiC wafer of claim 38, wherein the TDD is less than or equal to 2500 per cm$^2$.

45. The SiC wafer of claim 38, wherein the TDD is less than or equal to 1500 per cm.

46. The SiC wafer of claim 38, further comprising a diameter that is greater than or equal to 145 mm and less than or equal to 180 mm.

* * * * *